(12) United States Patent
Galton et al.

(10) Patent No.: US 10,735,005 B2
(45) Date of Patent: Aug. 4, 2020

(54) MULTI-RATE DEM WITH MISMATCH NOISE CANCELLATION FOR DIGITALLY-CONTROLLED OSCILLATORS

(71) Applicant: The Regents of the University of California, Oakland, CA (US)

(72) Inventors: Ian Galton, Del Mar, CA (US); Enrique Alvarez-Fontecilla, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 16/546,717

(22) Filed: Aug. 21, 2019

(65) Prior Publication Data

US 2020/0067514 A1 Feb. 27, 2020

Related U.S. Application Data

(60) Provisional application No. 62/722,276, filed on Aug. 24, 2018.

(51) Int. Cl.
| | |
|---|---|
| *H03L 7/089* | (2006.01) |
| *H03L 7/197* | (2006.01) |
| *H03L 7/099* | (2006.01) |
| *H03L 7/193* | (2006.01) |
| *H03L 7/093* | (2006.01) |
| *H03M 3/00* | (2006.01) |

(52) U.S. Cl.
CPC .......... *H03L 7/0891* (2013.01); *H03L 7/093* (2013.01); *H03L 7/0991* (2013.01); *H03L 7/193* (2013.01); *H03L 7/1976* (2013.01); *H03M 3/362* (2013.01)

(58) Field of Classification Search
CPC ... H03L 7/0891; H03L 7/1976; H03L 7/0991; H03L 7/193; H03L 7/093; H03M 3/362
USPC ................ 341/143, 131, 110; 375/376, 303; 455/260; 331/1 A, 34, 17, 16
See application file for complete search history.

(56) References Cited

PUBLICATIONS

An All Digital Approach to Supply Noise Cancellation in Digital Phase-Locked Loop, Won Namgoong IEEE Transactions on VLSI sytems, vol. 24, No. 3, Mar. 2016 (Year: 2016).*

* cited by examiner

*Primary Examiner* — Arnold M Kinkead
(74) *Attorney, Agent, or Firm* — Greer, Burns & Crain; Steven P. Fallon

(57) ABSTRACT

A digital fractional-N phase locked loop (PLL) with multi-rate dynamic element matching (DEM) and an adaptive mismatch-noise cancellation (MNC) is provided. The PLL includes a phase error to digital converter and a digital loop filter to suppress quantization noise of the phase error to digital converter and drive a digitally controlled oscillator. A digitally controlled oscillator (DCO) with a multi-rate DEM encoder includes an integer bank of frequency control elements (FCE) and a fractional bank of frequency control elements. Adaptive mismatch-noise cancellation logic operates to cancel DCO phase error arising from frequency control element (FCE) static and dynamic mismatch error by estimating ideal MNC coefficient values during PLL normal operation, estimating MNC coefficient errors at each sample time, and updating the MNC coefficient values to approach zero (FCE) static and dynamic mismatch error.

7 Claims, 15 Drawing Sheets

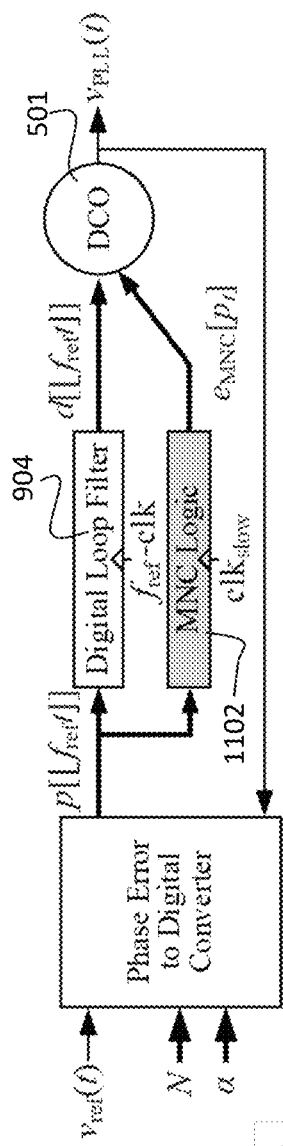
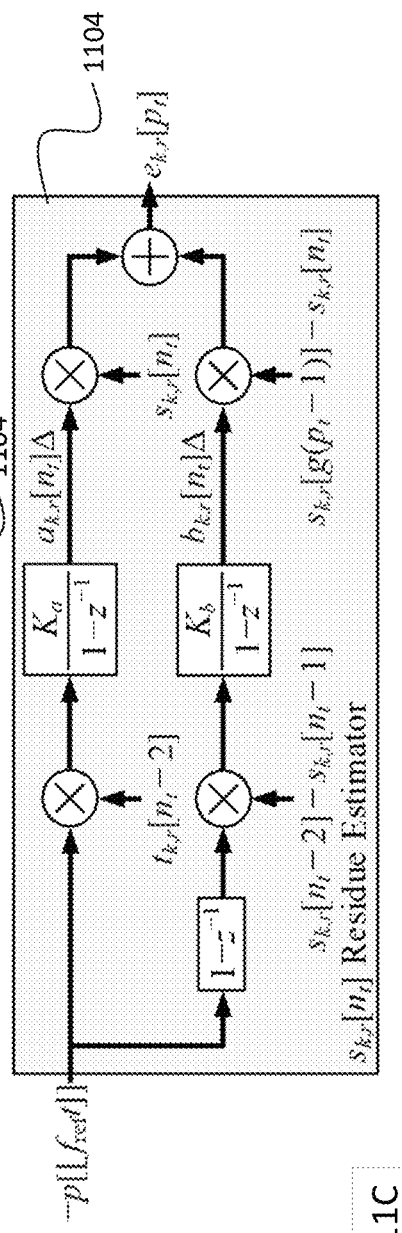
FIG. 11A
FIG. 11B
FIG. 11C

MULTI-RATE DEM WITH MISMATCH NOISE CANCELLATION FOR DIGITALLY-CONTROLLED OSCILLATORS

PRIORITY CLAIM AND REFERENCE TO RELATED APPLICATION

The application claims priority under 35 U.S.C. § 119 and all applicable statutes and treaties from prior provisional application Ser. No. 62/722,276, which was filed Aug. 24, 2018, and is incorporated by reference herein.

STATEMENT OF GOVERNMENT INTEREST

This invention was made with government support under grant number 1617545 awarded by National Science Foundation. The government has certain rights in the invention.

FIELD

A field of the invention is frequency synthesis. Example applications of the invention are in clock generation, in wired and in wireless communications. A particular application of the invention is in wireless transceivers for the generation of radio frequency (RF) local oscillator signals used to up-convert and down-convert transmitted and received RF signals.

LIST OF ABBREVIATIONS

The following abbreviations are used in the description and are provided here for ease of reference.
CMOS Complementary Metal Oxide Semiconductor
DCO Digitally Controlled Oscillator
DEM Dynamic Element Matching
DLF Digital Loop Filter
FCE Frequency Control Element
IC Integrated Circuit
LC-Based Inductor-Capacitor Based
MNC Mismatch-Noise Cancellation
PEDC Phase-error-to-digital converter
PLL Phase Locked Loop
PSD Power Spectral Density
RF Radio Frequency
SB Digital Switching Block

BACKGROUND

Evolving wireless communication standards place increasingly stringent performance requirements on the frequency synthesizers that generate RF local oscillator signals for up and down conversion in wireless transceivers. Conventional analog fractional-N PLLs with digital delta-sigma (Δs) modulation are the current standard for such frequency synthesizers because of their excellent noise and spurious tone performance. See, e.g., T. A. Riley, M. A. Copeland, T. A. Kwasniewski, "Delta-sigma modulation in fractional-N frequency synthesis," IEEE Journal of Solid-State Circuits, vol. 28, no. 5, pp. 553-559, May 1993. Unfortunately, they require high-performance analog charge pumps and large-area analog filters, so the trends of CMOS technology scaling and increasingly dense system-on-chip integration have created an inhospitable environment for them.

Digital fractional-N PLLs have been developed over the last decade to address this problem. See, e.g., C. Hsu, M. Z. Straayer, M. H. Perrott, "A Low-Noise, Wide-BW 3.6 GHz Digital ΔΣ Fractional-N Frequency Synthesizer with a Noise-Shaping Time-to-Digital Converter and Quantization Noise Cancellation," IEEE International Solid-State Circuits Conference, pp. 340-341, February 2008. They avoid large analog loop filters and can tolerate device leakage and low supply voltages which makes them better-suited to highly-scaled CMOS technology than analog PLLs. They are increasingly used in place of analog PLLs as frequency synthesizers. To date, analog PLLs have the best phase error performance, but digital PLLs have the lowest circuit area and are more compatible with highly-scaled CMOS IC technology. Thus, reducing phase error in digital PLLs has been the subject of intensive research and development for over a decade.

A continuing problem in digital PLLs concerns frequency control element (FCE) mismatches. Such FCE mismatches remain a significant source of phase error in high-performance digital PLLs. See, C. Weltin-Wu, E. Familier, and I. Galton, "A linearized model for the design of fractional-N digital PLLs based on dual-mode ring oscillator FDCs," IEEETrans.Circuits Syst. I, Reg.Papers, vol. 62, no. 8, pp. 2013-2023, August 2015. Prior attempts to address the FCE mismatch problem use an offline calibration technique that requires several minutes to complete. See, O. Eliezer, B. Staszewski, J. Mehta, F. Jabbar, and I. Bashir, "Accurate self-characterization of mismatches in a capacitor array of a digitally-controlled oscillator," in Proc. IEEE Dallas Circuits Syst. Workshop, October 2010, pp. 17-18; O. Eliezer, B. Staszewski, and S. Vemulapalli, "Digitally controlled oscillator in a 65 nm GSM/EDGE transceiver with built-in compensation for capacitor mismatches," in Proc. IEEE Radio Freq. Integr. Circuits Symp., June 2011, pp. 5-7.

A digitally controlled oscillator (DCO) is an oscillator whose frequency is controlled by one or more FCEs, each of which is controlled by a 1-bit digital sequence. For instance, each FCE in an LC-based DCO contributes to the DCO's tank a capacitance that takes on one of two values depending on the state of the FCE's input bit. Changing the FCE's input bit increases or decreases the DCO frequency by a fixed frequency step.

The instantaneous frequency of a DCO is given by a fixed offset frequency plus $f_{tune}(t)$, where:

$$f_{tune}(t) = \sum_{i=1}^{N_{FCE}} f_i(t), \quad (1)$$

$N_{FCE}$ is the number of FCEs in the DCO, and $f_i(t)$ is the contribution of the ith FCE to the DCO frequency. Ideally, $$f_i(t) = (b_i[m_t] - \tfrac{1}{2})\Delta_i, \quad (2)$$

where $b_i[m]$ is the FCE's input bit value (either 0 or 1) over the mth clock interval, $m_t = \lfloor f_{FCE} t \rfloor$, $f_{FCE}$ is the clock-rate of the input bit, and $\Delta_i$ is the FCE's frequency step size.

The DCO's input sequence, $d[n]$, represents the ideal value of $f_{tune}(t)$ over the nth clock interval. For example, suppose $d[n]$ is represented as a 16-bit two's complement code where the least significant bit (LSB) represents a DCO frequency step of $\Delta$ (e.g., $\Delta = 100$ Hz). Then $$d[n] = \left(-2^{15} d_{15}[n] + \sum_{i=0}^{14} 2^i d_i[n]\right)\Delta, \quad (3)$$

where $d_i[n]$, for each $i = 0, 1, \ldots, 15$, is the value of the ith bit of the code (either 0 or 1) over the nth clock interval.

Ideally, $f_{tune}(t)=d[n_t]$, where $n_t=\lfloor f_{in}t \rfloor$ and $f_{in}$ is the clockrate of the DCO input. Equations (1)-(3) with $f_{FCE}=f_{in}$ imply that this can be achieved with a bank of 16 FCEs, where the ith FCE's frequency step size is $\Delta_i=2^{i-1}\Delta$, $b_i[n]=d_{i-1}[n]$ for $i=1, 2, \ldots, 15$, and $b_{16}[n]=1-d_{15}[n]$.

Unfortunately, in PLL applications that require low phase noise, such as local oscillator synthesis for cellular telephone transceivers, DCOs with minimum frequency steps of tens of Hz are required, but most existing FCEs have minimum frequency steps of tens of kHz or more. A common solution to this problem is described next for an example case in which $f_{tune}(t)$ needs to be controlled in steps of $\Delta$, yet the smallest realizable FCE frequency step size is $\Delta_{min}=2^8\Delta$. In this case, the 8 LSBs of $d[n]$ are said to represent the fractional part of $d[n]$ because they cause DCO frequency steps that are fractions of $\Delta_{min}$, and the 8 most significant bits (MSBs) of $d[n]$ are said to represent the integer part of $d[n]$ because they cause DCO frequency steps that are multiples of $\Delta_{min}$.

The basic approach utilizes two FCE banks: an integer FCE bank controlled by the integer part of $d[n]$, and a fractional FCE bank controlled by the output of an oversampling digital $\Delta\Sigma$ modulator driven by the fractional part of $d[n]$. The $\Delta\Sigma$ modulator's highpass-shaped quantization noise is lowpass filtered by the DCO, so provided the oversampling rate is sufficiently high, it negligibly contributes to the DCO's phase error.

FIG. 1 shows a specific example in the context of an LC-based DCO, where $p_t=\lfloor f_{fast}t \rfloor$, $f_{fast} \gg f_{it}$, and $d_I[n_t]$ and $d_F[n_t]$ are the integer and fractional parts of $d[n_t]$, respectively. The $f_{fast}$-clk signal is such that $p_t$ changes synchronously with $n_t$, so that $n_t$ can be written as a function of $p_t$, i.e., $$n_t = g(p_t). \tag{4}$$

In this example $g(p_t)=\lfloor (f_{in}/f_{fast})p_t \rfloor$, where $f_{fast}/f_{in}$ is an integer much greater than 1.

It follows from (3) that $d[n_t]=d_I[n_t]+d_F[n_t]$, where $$d_I[n_t] = \left(-2^{15}d_{15}[n_t] + \sum_{i=8}^{14} 2^i d_i[n_t]\right)\Delta \tag{5}$$

and $$d_F[n_t] = \Delta \sum_{i=0}^{7} 2^i d_i[n_t]. \tag{6}$$

As shown in FIG. 1, $d_F[n_t]$ is sampled at a rate of $f_{fast}$ by a second-order digital $\Delta\Sigma$ modulator. The $\Delta\Sigma$ modulator's output is a four-level sequence quantized to multiples of $\Delta_{min}$ and can be written as $$y_{\Delta\Sigma}[p_t]=d_F[n_t]+e_{\Delta\Sigma}[p_t], \tag{7}$$

where $e_{\Delta\Sigma}[p_t]$ is second-order highpass-shaped quantization noise plus any dither used within the $\Delta\Sigma$ modulator. A thermometer encoder maps $y_{\Delta\Sigma}[p_t]$ to a 4-bit thermometer code which drives a bank of four FCEs, each with a frequency step of $\Delta_{min}$. It follows from (1), (2) and (7) that the contribution of the fractional FCE bank to the DCO frequency, $f_F(t)$, is $$f_F(t) = \sum_{i=1}^{4} f_i(t) = d_F[n_t] + e_{\Delta\Sigma}[p_t]. \tag{8}$$

The integer FCE bank is directly driven by $d_I[n_t]$. Specifically, the ith FCE, for $i=5, 6, \ldots, 11$, has input $b_i[n_t]=d_{i+3}[n_t]$ and frequency step size $\Delta_i=2^{i+3}\Delta$, and the 12th FCE has input $b_{12}[n_t]=1-d_{15}[n_t]$ and frequency step size $\Delta_{12}=2^{15}\Delta$. It follows from (1), (2) and (5) that the contribution of the integer FCE bank to the DCO frequency, $f_I(t)$, is $$f_I(t) = \sum_{i=5}^{12} f_i(t) = d_I[n_t], \tag{9}$$

where a constant additive term has been omitted.

The contribution of the two FCE banks to the DCO frequency is $f_{tune}(t)=f_I(t)+f_F(t)$, so (8) and (9) imply that $$f_{tune}(t)=d[n_t]+e_{\Delta\Sigma}[p_t]. \tag{10}$$

Accordingly, $e_{\Delta\Sigma}[p_t]$ causes DCO frequency error. The DCO's phase error is the integral of its frequency error, so as mentioned above, a lowpass-filtered version of $e_{\Delta\Sigma}[p_t]$ appears as a component of the DCO's phase error. Given that $e_{\Delta\Sigma}[p_t]$ has a highpass-shaped spectrum that peaks at $f_{fast}/2$, its contribution to the DCO's phase error can be made negligible relative to other sources of phase error if $f_{fast}$ is large enough.

The analysis above presumes that the FCEs are ideal. Unfortunately, non-ideal circuit behavior causes $f_i(t)$ to deviate from (2). For example, suppose for now that $f_i(t)$ is modeled as ideal except for a static gain error given by $\alpha_i$, i.e.

$$f_i(t)=(b_i[m_t]-\tfrac{1}{2})\alpha_i\Delta_i. \tag{11}$$

Ideally, $\alpha_i=1$ for $i=1, 2, \ldots, N_{FCE}$, but inevitable component mismatches introduced during fabrication cause $\alpha_i$ to deviate from 1.

Repeating the analysis for the example in FIG. 1 with (11) in place of (2) gives $$f_{tune}(t)=\alpha_F f_{tune\text{-}ideal}(t)+e_F(t)+e_I(t)+(\alpha_I-\alpha_F)d_I[n_t], \tag{12}$$

where $f_{tune\text{-}ideal}(t)$ is given by the right side of (10), $\alpha_F$ and $\alpha_I$ are the averages of $\alpha_i$ for $i=1, 2, 3, 4$ and $i=5, 6, \ldots, 12$, respectively, $$e_F(t) = \sum_{i=1}^{4} (\alpha_i - \alpha_F)(b_i[p_t] - 1/2)\Delta_{min} \tag{13}$$

and $$e_I(t) = \sum_{i=5}^{12} (\alpha_i - \alpha_I)(b_i[n_t] - 1/2)\Delta_i. \tag{14}$$

where $f_{tune\text{-}ideal}(t)$ is given by the right side of (10), $\alpha_F$ and $\alpha_I$ are the averages of $\alpha_i$ for $i=1, 2, 3, 4$ and $i=5, 6, \ldots, 12$, respectively.

Hence, the FCE static gain errors introduce a gain factor, $\alpha_F$, and three additive error terms to $f_{tune}(t)$. The $\alpha_F$ gain factor does not significantly degrade performance in typical PLLs. In contrast, as explained next, the three additive error terms in (12) tend to cause spurious tones and increase phase error in PLLs because they are nonlinear functions of $d[n_t]$.

The individual bits of $d[n]$, i.e., $d_i[n]$, for each $i=0, 1, \ldots, 15$, each depend on $d[n]$ but are restricted to values of 0 and 1. Hence, each $d_i[n]$ is a nonlinear function of $d[n]$. Nevertheless, they can be combined as in (3) to yield $d[n]$, which implies that multiplying $d_0[n], d_1[n], \ldots, d_{14}[n]$, and $d_{15}[n]$ by $2^0, 2^1, \ldots, 2^{14}$, and $-2^{15}$, respectively, and adding the results causes the nonlinear components from the individual bits to cancel each other. Any deviation from a set of scale factors proportional to those mentioned above prevents full cancellation of the nonlinear components. It can be verified from (5), (13) and (14) that $e_F(t)$, $e_f(t)$, and $(\alpha_f-\alpha_F)$ $d_f[n_r]$ are each a function of a subset of the individual bits of $d[n_r]$, so they are nonlinear functions of $d[n_r]$.

A partial solution to this problem is to replace the thermometer encoder in FIG. 1 with a mismatch-shaping DEM encoder. See, I. Galton, "Why Dynamic-Element-Matching DACs Work," *IEEE Trans. Circuits Syst. II Exp. Briefs*, vol. 57, no. 2, pp. 69-74, March 2010. Doing so would cause $e_F(t)$ to be replaced by highpass-shaped noise that is free of nonlinear distortion and is uncorrelated with $d[n_r]$, so it would be suppressed by the DCO 102 like the $\Delta\Sigma$ quantization noise. Similarly, the integer FCE bank 104 could be modified to accommodate a mismatch-shaping DEM encoder clocked at a rate of $f_{in}$, which would cause $e_f(t)$ to be replaced by shaped noise that is free of nonlinear distortion and is uncorrelated with $d[n_r]$. However, $f_{in} \square f_{fast}$, less of the shaped noise would be suppressed by the DCO 102. Unfortunately, DEM as described above would not help prevent the last term in (12) from introducing nonlinear distortion because $d_f[n_r]$ is a non-linear function of $d[n_r]$.

The last two terms in (12) increase the phase error in a PLL unless $d_f[n_r]$ remains constant once the PLL is locked. See, C. Weltin-Wu, G. Zhao, and I. Galton, "A Highly-Digital Frequency Synthesizer Using Ring-Oscillator Frequency-to-Digital Conversion and Noise Cancellation," *IEEE International Solid-State Circuits Conf.*, pp. 1-3, February 2015. In most published digital PLLs $d[n]$ varies by much less than $\Delta_{min}$ when the PLL is locked, and measured results are usually presented for PLL frequencies at which $d_f[n_r]$ does not change during the measurement interval. This renders the last two terms in (12) constant, so they do not contribute phase error. Unfortunately, this is not a viable option in practice because DCO center frequency drift caused by flicker noise, voltage and temperature variations, and pulling from external interference cause $d[n_r]$ to vary by far more than $\Delta_{min}$ over time. For instance, measurement results indicate that the frequency of the DCO presented in [C. Weltin-Wu, G. Zhao, and I. Galton, "A Highly-Digital Frequency Synthesizer Using Ring-Oscillator Frequency-to-Digital Conversion and Noise Cancellation," *IEEE International Solid-State Circuits Conf.*, pp. 1-3, February 2015] varies by about −200 kHz/° C., which corresponds to ~$7\Delta_{min}$ per degree Celsius. In practice, this causes the digital PLL's phase noise to increase drastically from time to time as $d[n_r]$ slowly drifts past integer multiples of $\Delta_{min}$. This issue is sometimes called "spectral breathing" because the phase noise spectrum, as viewed on laboratory measurement equipment, appears to swell up every now and then as if it is taking deep breaths. During these "breaths" the PLL's performance is extremely degraded. Furthermore, when the PLL is used to generate phase or frequency modulated signals, such as a GFSK signal for a Bluetooth transmitter, $d[n_r]$ typically varies by more than $\Delta_{min}$, so there are no periods between "breaths" during which the phase noise performance is good.

To address this problem, a single bank of FCEs driven by a $\Delta\Sigma$ modulator and a mismatch-shaping DEM encoder could be used, where the $\Delta\Sigma$ modulator oversamples $d[n_r]$ instead of just $d_F[n_r]$. The DEM encoder would cause any mismatches among the FCEs to contribute shaped noise instead of nonlinear distortion, and the oversampling would ensure that most of the noise is suppressed by the DCO. Unfortunately, high oversampling ratios would be required in practice, which makes this solution impractical because of the associated high-power consumption

SUMMARY OF THE INVENTION

A preferred embodiment is a digital fractional-N phase locked loop (PLL) with multi-rate dynamic element matching (DEM) and an adaptive mismatch-noise cancellation (MNC). The PLL includes a phase error to digital converter (PEDC) and a digital loop filter to suppress quantization noise of the PEDC and drive a digitally controlled oscillator. A digitally controlled oscillator (DCO) with a multi-rate DEM encoder includes an integer bank of frequency control elements (FCE) and a fractional bank of frequency control elements. Adaptive mismatch-noise cancellation logic operates to cancel DCO phase error arising from frequency control element (FCE) static and dynamic mismatch error by estimating ideal MNC coefficient values during PLL normal operation, estimating MNC coefficient errors at each sample time, and updating the MNC coefficient values to approach zero (FCE) static and dynamic mismatch error.

BRIEF DESCRIPTION OF THE DRAWINGS

FIGS. 11A-11C are block diagrams that illustrate a preferred digital fractional-N PLL with the multi-rate DEM encoder and MNC;

DESCRIPTION OF PREFERRED EMBODIMENTS

Preferred embodiment methods and digital oscillators provide multi-rate dynamic element matching (DEM) and an adaptive mismatch-noise cancellation (MNC) that work together to address FCE mismatches. The DEM and the MNC run during normal PLL operation, and the MNC typically converges in a few seconds from a cold start. A preferred DEM has been simulated and succeeds in reducing noise from the FCE mismatches. The MNC cancels DCO phase error arising from FCE mismatch error. Ideal MNC coefficient values are estimated, during PLL normal operation, as part of the feedback loop in a digital fractional-N PLL that incorporates the DCO.

The center frequency of a conventional digitally-controlled oscillator (DCO) drifts over time due to flicker noise, voltage and temperature variations, and pulling from external interference. Given that the DCO frequency is a non-linear function of the DCO's input signal, this causes the digital PLL's phase noise to increase drastically from time to time because the DCO's input signal slowly drifts to counteract the DCO's center frequency drift. This issue is called spectral breathing because the phase noise spectrum, as viewed on laboratory measurement equipment, appears to swell up every now and then as if it is taking deep breaths of air, during which the PLL's performance is extremely degraded. Moreover, when the PLL is used to generate phase or frequency modulated signals there are no periods between breaths during which the phase noise performance is good. Spectral breathing can drastically degrade a digital PLL's phase noise. Preferred embodiments address spectral breathing by making the relation between the DCO frequency and its input signal linear, which is done at the expense of initially adding more noise to the system. However, this added noise has properties that can be exploited to cancel it, so that the digital PLL's performance is no longer degraded when the DCO's input signal changes. Overall, the price is only a slightly higher power consumption.

Figure 1:
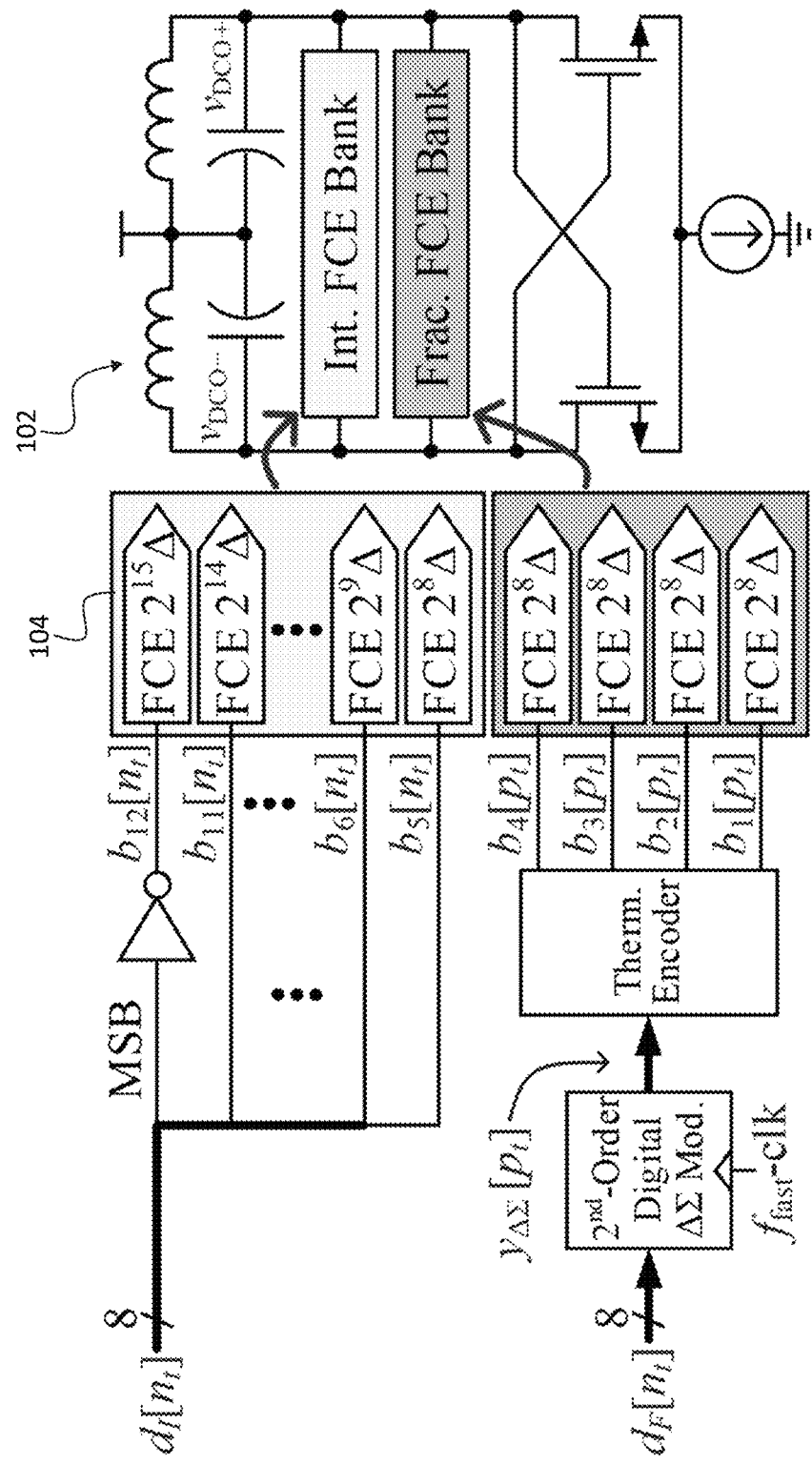
FIG. 1 (Prior Art) is a schematic diagram of a frequency control technique for an LC-based DC)

Preferred embodiments provide a new multi-rate DEM technique and an MNC technique that work together within a PLL to solve the problems that arise from FCE mismatches are presented. As in FIG. 1, the preferred embodiment uses integer and fractional FCE banks. In the preferred embodiment, both FCE banks are driven by a multi-rate DEM encoder, which ensures that the error arising from FCE mismatches is free of nonlinear distortion. In addition, the multi-rate DEM encoder avoids high power consumption because most of its digital logic is clocked at a rate of $f_{in}$ instead of $f_{fast}$. Although the hardware of preferred embodiments is different from that of the solution in which $d[n_t]$ is oversampled and a DEM encoder clocked at a high rate is used to control the FCEs, a pessimistic power consumption analysis indicates that the preferred techniques are at least five times more power-efficient. Much of the additive error is not oversampled, so instead of relying on the DCO to suppress it, the MNC technique adaptively measures the error and cancels it in real time.

Preferred embodiments of the invention will now be discussed with respect to the drawings and experiments used to demonstrate the invention. The drawings may include schematic and/or block representations, which will be understood by artisans in view of the general knowledge in the art and the description that follows.

FCEs with $\Delta_i > \Delta_{min}$ are usually built by connecting nominally identical minimum-weight FCEs in parallel. Static mismatches among these FCEs are sources of error, but other non-idealities such as the non-instantaneous frequency transitions of realizable FCEs are also sources of error. Hence, a more comprehensive model than (11) for $f_i(t)$ is $$f_i(t)=(b_i[m_t]-\tfrac{1}{2})\Delta_i+e_i(t), \qquad (15)$$

where $e_i(t)$ is error that models both the static mismatch and the non-ideal frequency transitions of the ith FCE. $b_i[m]$ is the FCE's input bit value (either 0 or 1) over the mth clock interval, as defined above in (2). FCEs are designed such that frequency transitions caused by input bit changes settle within a clock period, so $e_i(t)$ only depends on $b_i[m_t-1]$ and $b_i[m_t]$. This can be modeled as $$e_i(t) = \begin{cases} e_{11i}, & \text{if } b_i[m_t-1]=1, b_i[m_t]=1, \\ e_{01i}(t), & \text{if } b_i[m_t-1]=0, b_i[m_t]=1, \\ e_{00i}, & \text{if } b_i[m_t-1]=0, b_i[m_t]=0, \\ e_{10i}(t), & \text{if } b_i[m_t-1]=1, b_i[m_t]=0 \end{cases} \qquad (16)$$

where $e_{11i}$, $e_{01i}(t)$, $e_{00i}$, and $e_{10i}(t)$ represent the error over each clock interval corresponding to the four different possibilities of the FCE's current and prior input bit values. The FCE model given by (15) and (16) is analogous to that of a non-return-to-zero (NRZ) 1-bit DAC. To prevent $e_i(t)$ from depending on $b_i[m_t-1]$, return-to-zero (RZ) FCEs could be implemented by setting the FCEs to a signal-independent state for a fraction of each clock period, but this is not practical for PLLs because it would periodically slew the DCO frequency and thereby introduce excessive phase noise.

Figure 2:
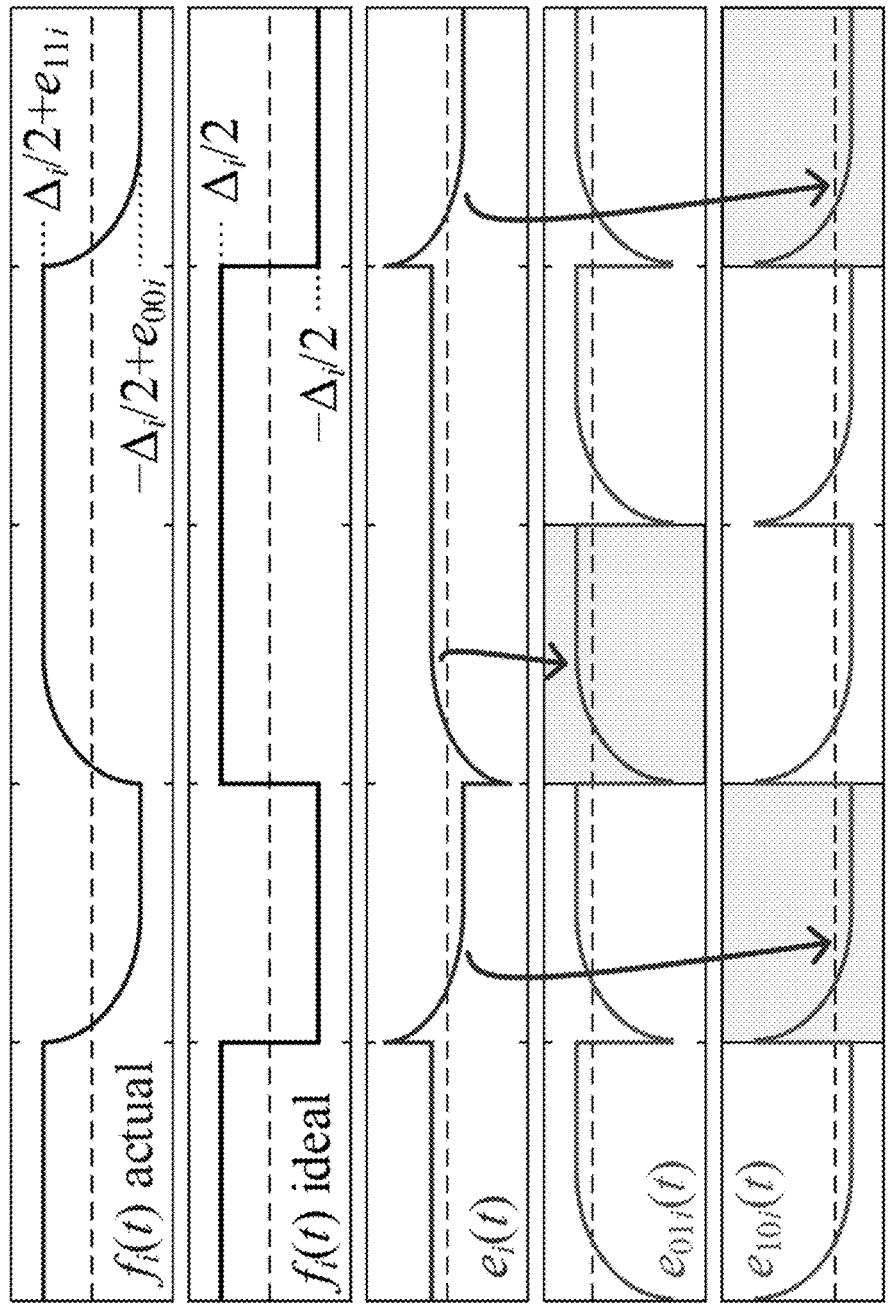
FIG. 2 includes a set of example waveforms related to equations (15) and (16) to provide a visual representation of the effects of FCE mismatches on the DCO frequency.

FIG. 2 shows example waveforms associated with (15) and (16). A consequence of the frequency transitions settling within a clock period is that when an FCE's input bit does not change between clock periods, neither does its contribution to the DCO frequency, so $e_{00i}$ and $e_{11i}$ are constant. In contrast, $e_{01i}(t)$ and $e_{10i}(t)$ are not constant because they represent deviations from the FCE's ideal instantaneous frequency transitions when its input bit changes. As shown in FIG. 2, the shape of each of these frequency transitions depends only on whether the corresponding FCE input changed from 0 to 1 or 1 to 0, and both $e_{01i}(t)$ and $e_{10i}(t)$ are $1/f_{FCE}$-periodic.

Experimental results indicate, at least for the LC-based DCOs presented in [C. Venerus and I. Galton, "A TDC-Free Mostly-Digital FDC-PLL Frequency Synthesizer with a 2.8-3.5 GHz DCO," IEEE J. Solid-State Circuits, vol. 50, no. 2, pp. 450-463, February 2015] and [C. Weltin-Wu, E. Familier, and I. Galton, "A Linearized Model for the Design of Fractional-N PLLs based on Dual-Mode Ring Oscillator FDCs," IEEE Trans. Circuits Syst. I, Reg. Papers, vol. 62, no. 8, pp. 2013-2023, August 2015], that the frequency transition introduced by each FCE when its input bit changes from 0 to 1 and that when the input bit changes from 1 to 0 are antisymmetric to a high degree of accuracy, i.e., $e_{11i}-e_{01i}(t)=-[e_{00i}-e_{10i}(t)]$. Therefore, substituting (16) into (15), applying this observation, collecting terms and omitting constant additive terms yields.

$$f_i(t)=(b_i[m_t]-\tfrac{1}{2})\alpha_i(t)\Delta_i+(b_i[m_t-1]-\tfrac{1}{2})\gamma_i(t), \qquad (17)$$

where $$\alpha_i(t)=1+(e_{01i}(t)-e_{00i})/\Delta_i \text{ and } \gamma_i(t)=e_{11i}-e_{01i}(t). \qquad (18)$$

Given that $\alpha_i(t)$ and $\gamma_i(t)$ are functions of $e_{01i}(t)$ and $e_{10i}(t)$, which are $1/f_{FCE}$-periodic, they are also $1/f_{FCE}$-periodic.

Multi-Rate DEM

Single-Rate Segmented DEM

Suppose the DCO's input sequence is given by (3), and for now suppose that $\Delta\Sigma$ quantization is not necessary because FCEs with small-enough step sizes are available, i.e., $\Delta_{min}=\Delta$. Even in this case, FCE mismatches are a problem because they cause nonlinear distortion. A conventional single-rate segmented DEM encoder can be used to prevent this problem. For example, the mismatch-shaping segmented DEM encoder shown in FIG. 3 can be used with 34 FCEs. See, K. L. Chan, N. Rakuljic, and I. Galton, "Segmented Dynamic Element Matching for High-Resolution Digital-to-Analog Conversion," *IEEE Trans. Circuits Syst. I, Reg. Papers*, vol. 55, no. 11, pp. 3383-3392, December 2008. The ith FCE has input $b_i[n_t]=c_i[n_t]$ and frequency step size $\Delta_i=K_i\Delta$, where $K_{2i-1}=K_{2i}=2^{i-1}$ for $i=1,2,\ldots,13$, and $$K_i=2^{13} \text{ for } i=27,28,\ldots,34. \quad (19)$$

The DEM encoder's input sequence, $c[n_t]$, is obtained from the DCO input sequence as $$c[n_t]=d[n_t]/\Delta+2^{15}+2^{13}-1 \quad (20)$$

Figure 3:
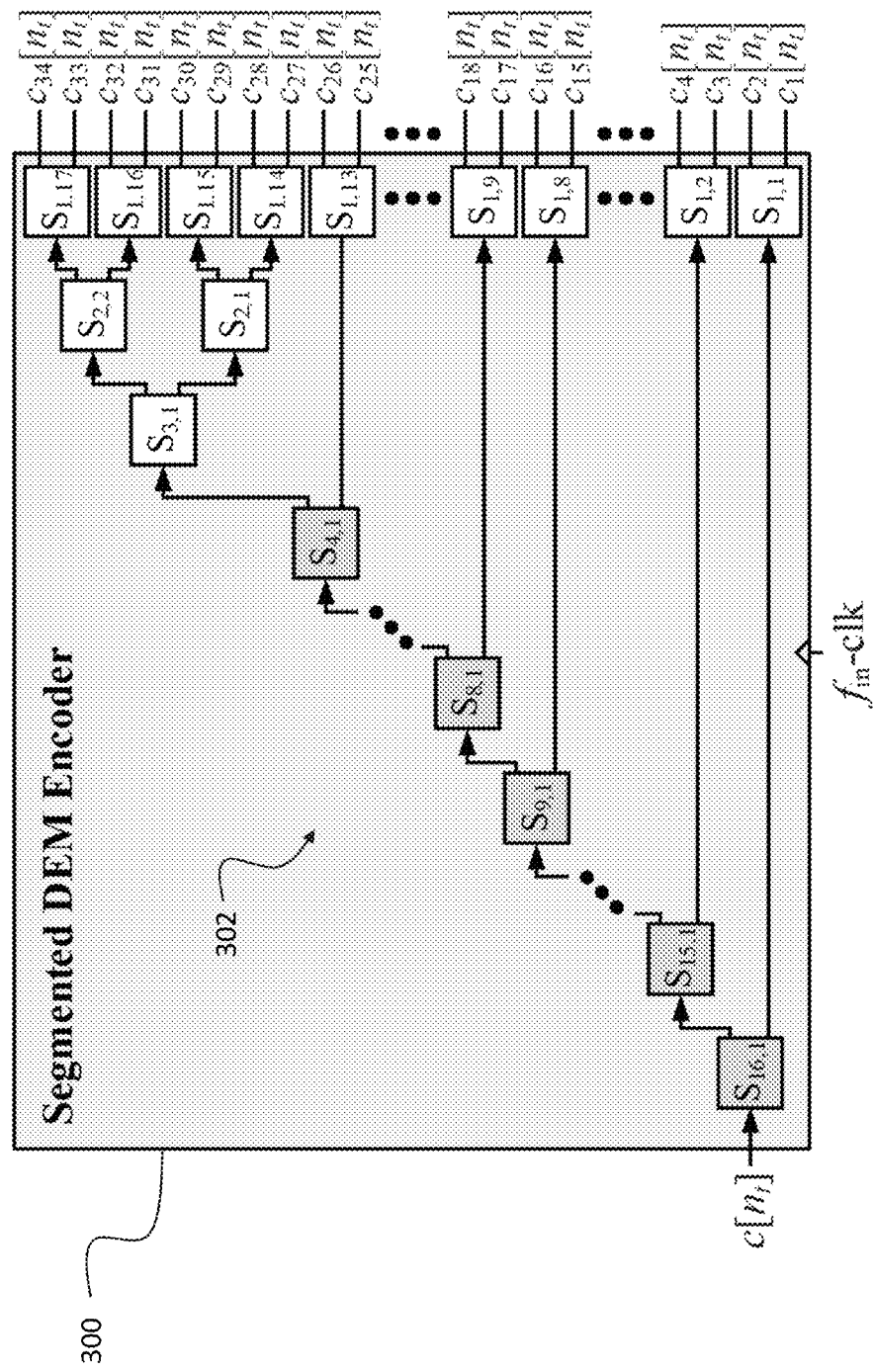
FIG. 3 (Prior Art) is a block diagram of a mismatch-shaping segmented DEM encoder.
Figures 4A, 4B, 4C:
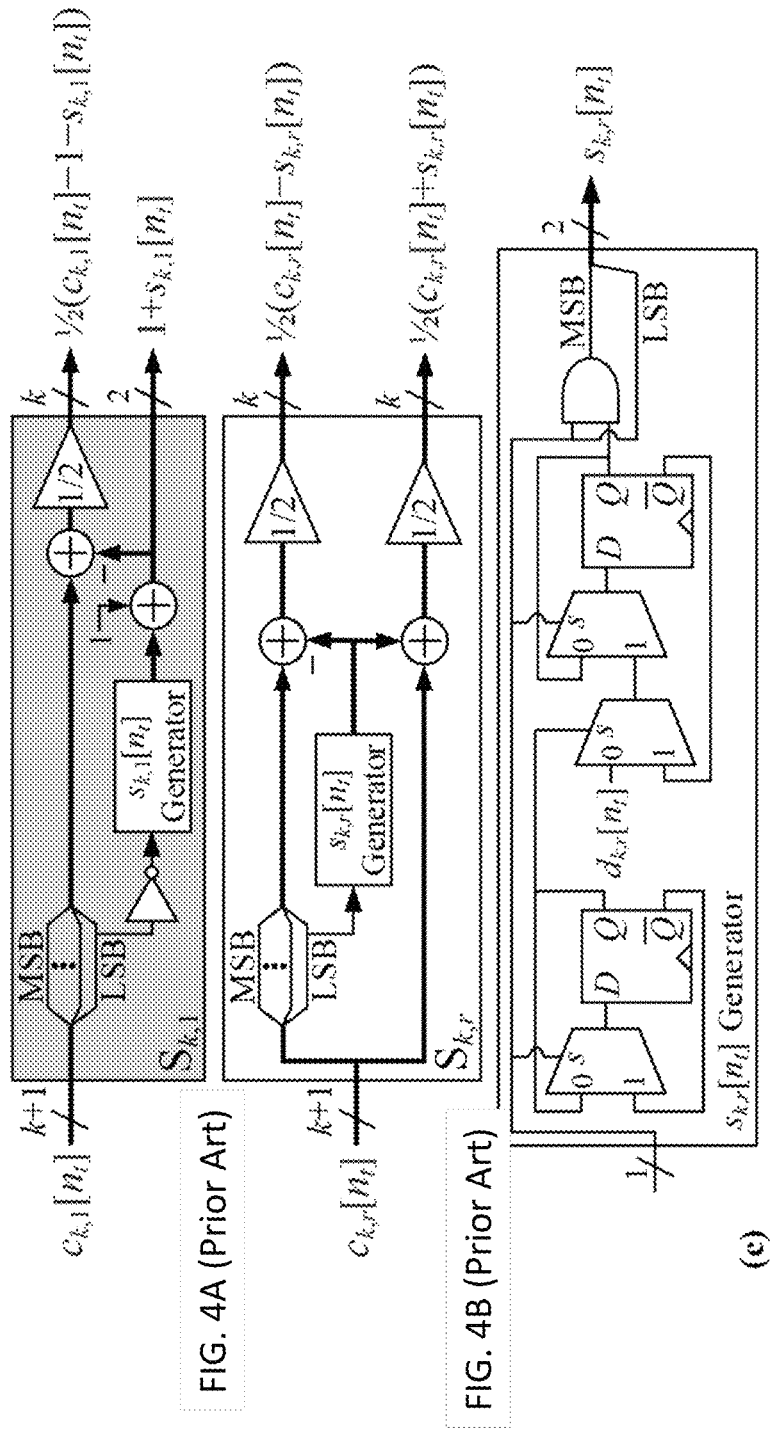
FIGS. 4A-4C (Prior Art) are block (4A & 4B) and schematic (4C) diagrams showing digital switching blocks of the FIG. 3 DEM encoder.

As shown in FIG. 3, the DEM encoder 300 consists of 33 digital switching blocks (SBs) 302, labeled $S_{k,r}$ for k=1, 2, ..., 16, and r=1, 2, ..., 17, configured in a tree structure. The 13 shaded SBs are called segmenting SBs, whereas the other 20 SBs are called non-segmenting SBs. The functional details of the SBs are shown in FIGS. 4A-4C. The top and bottom outputs of each segmenting SB are $\frac{1}{2}(c_{k,r}[n_t]-1-s_{k,1}[n_t])$ and $1+s_{k,1}[n_t]$, respectively, where $c_{k,1}[n_t]$ is the SB input sequence, and $s_{k,1}[n_t]$, called a switching sequence, is 0 when $c_{k,1}[n_t]$ is odd and ±1 otherwise. Similarly, the top and bottom outputs of each non-segmenting SB are $\frac{1}{2}(c_{k,r}[n_t]-s_{k,r}[n_t])$ and $\frac{1}{2}(c_{k,r}[n_t]+s_{k,r}[n_t])$, respectively, where $c_{k,r}[n_t]$ is the SB input sequence and $s_{k,r}[n_t]$ is 0 when $c_{k,r}[n_t]$ is even and ±1 otherwise.

Regardless of the SB type, each switching sequence is zero-mean and has a first-order highpass-shaped power spectral density (PSD) that peaks at $f_{in}/2$. It is generated in two's complement format by the logic shown in FIG. 4C, wherein $d_{k,r}[n_t]$ is generated within each SB and is well-modeled as a two-level white random sequence that takes on values of 0 and 1 with equal probability and is independent of the $d_{k,r}[n_t]$ sequences in the other SBs.

Extension to Multi-Rate Segmented DEM

Now suppose that the smallest practical FCE frequency step size is $\Delta_{min}=2^8\Delta$. As the lower 16 FCEs in the example above all have frequency step sizes smaller than $\Delta_{min}$, the bottom 16 outputs of the DEM encoder can no longer drive FCEs directly. The preferred multi-rate DEM architecture 500 in the DCO control logic 501 shown in FIG. 5 addresses this situation, where a bottom 4 FCEs make up a fractional FCE bank 502, the top 18 FCEs make up an integer FCE bank 504, and $w_t=p_t-1$ is a $T_{fast}$-delayed version of $p_t$, where $T_{fast}=1/f_{fast}$. As in FIG. 1, $n_t=g(p_t)$ changes synchronously with $p_t$.

A slow DEM encoder 506 is a modified version of the DEM encoder in FIG. 3. Its outputs $c_{17}[n_t], c_{18}[n_t], \ldots, c_{34}[n_t]$ are identical to those in FIG. 3, and instead of outputs $c_1[n_t], c_2[n_t], \ldots, c_{16}[n_t]$ it has an output, $x_f[n_t]$, supplied to a second order digital $\Delta\Sigma$ modulator 508, given by $$x_f[n_t] = \Delta \sum_{i=1}^{16} K_i(c_i[n_t]-1/2). \quad (21)$$

Each $c_i[n_t]$ takes on values of 0 and 1, so (19) and (21) imply that $|x_f[n_t]|\le 255\Delta$ and $x_f[n_t]$ is restricted to multiples of $\Delta$.

Figure 6:
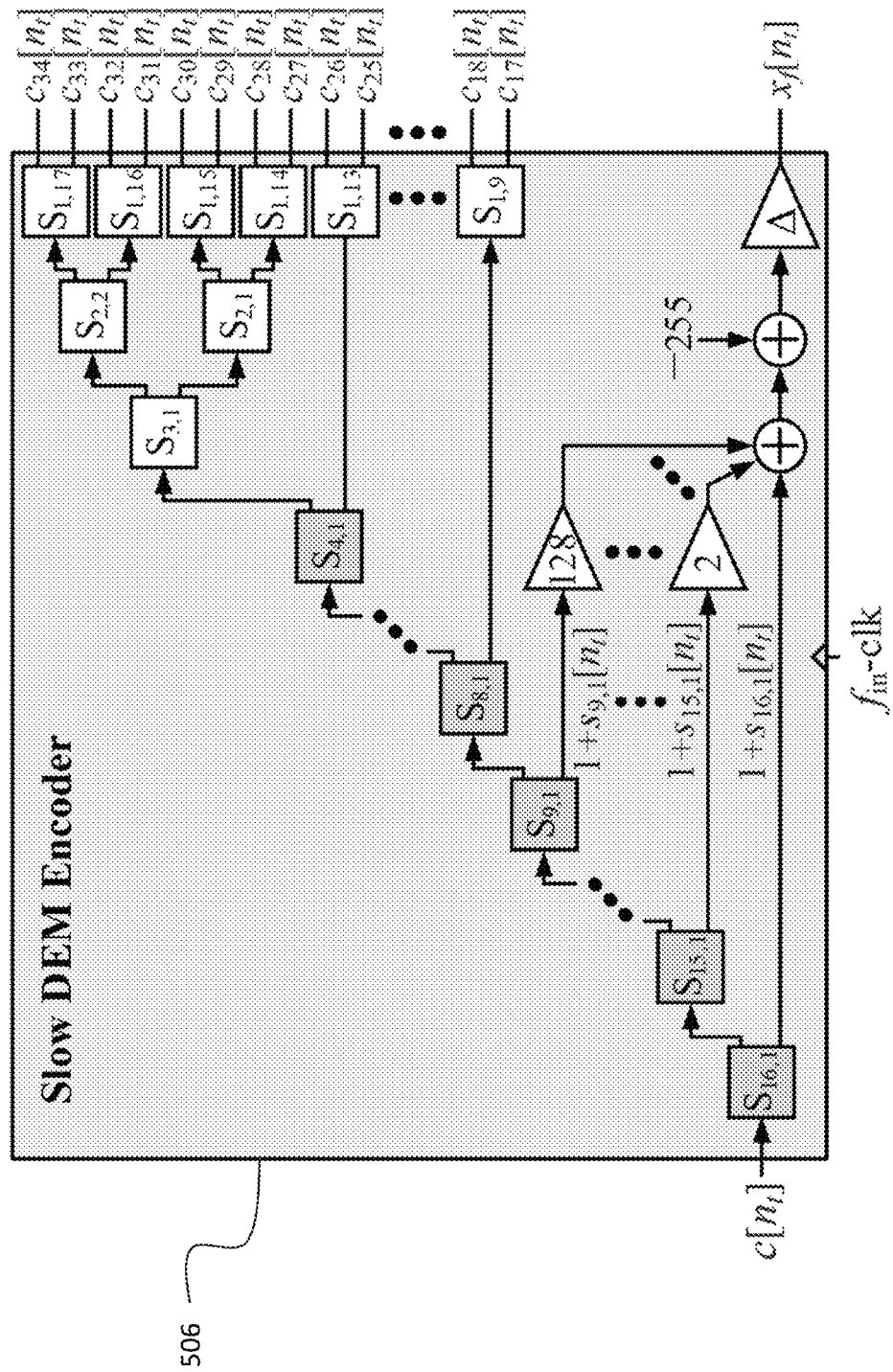
FIG. 6 is a block diagram of a preferred slow DEM encoder used in FIG. 5.

The slow DEM encoder could be implemented from the DEM encoder of FIG. 3 directly by combining $c_1[n_t], c_2[n_t], \ldots, c_{16}[n_t]$ as in (21), but the preferred structure of FIG. 6 provides a simpler and more elegant approach. As implied by FIG. 4B, the sum of the outputs of each non-segmenting SB is equal to the SB's input, so it follows from (21), FIG. 3 and FIG. 4A that $x_f[n_t]$ can be computed directly from the bottom outputs of $S_{16,1}, S_{15,1}, \ldots, S_{9,1}$ as $$x_f[n_t] = \Delta \sum_{k=9}^{16} 2^{16-k} s_{k,1}[n_t]. \quad (22)$$

Hence, as shown in FIG. 6, $S_{1,1}, S_{1,2}, \ldots, S_{1,8}$ are not necessary in the slow DEM encoder 506.

The $\Delta$ scale factor shown in FIG. 6 is not an actual multiplier; it just denotes that the subsequent digital logic should interpret the LSB of $x_f[n_t]$ to represent a DCO frequency step size of $\Delta$.

Figure 5:
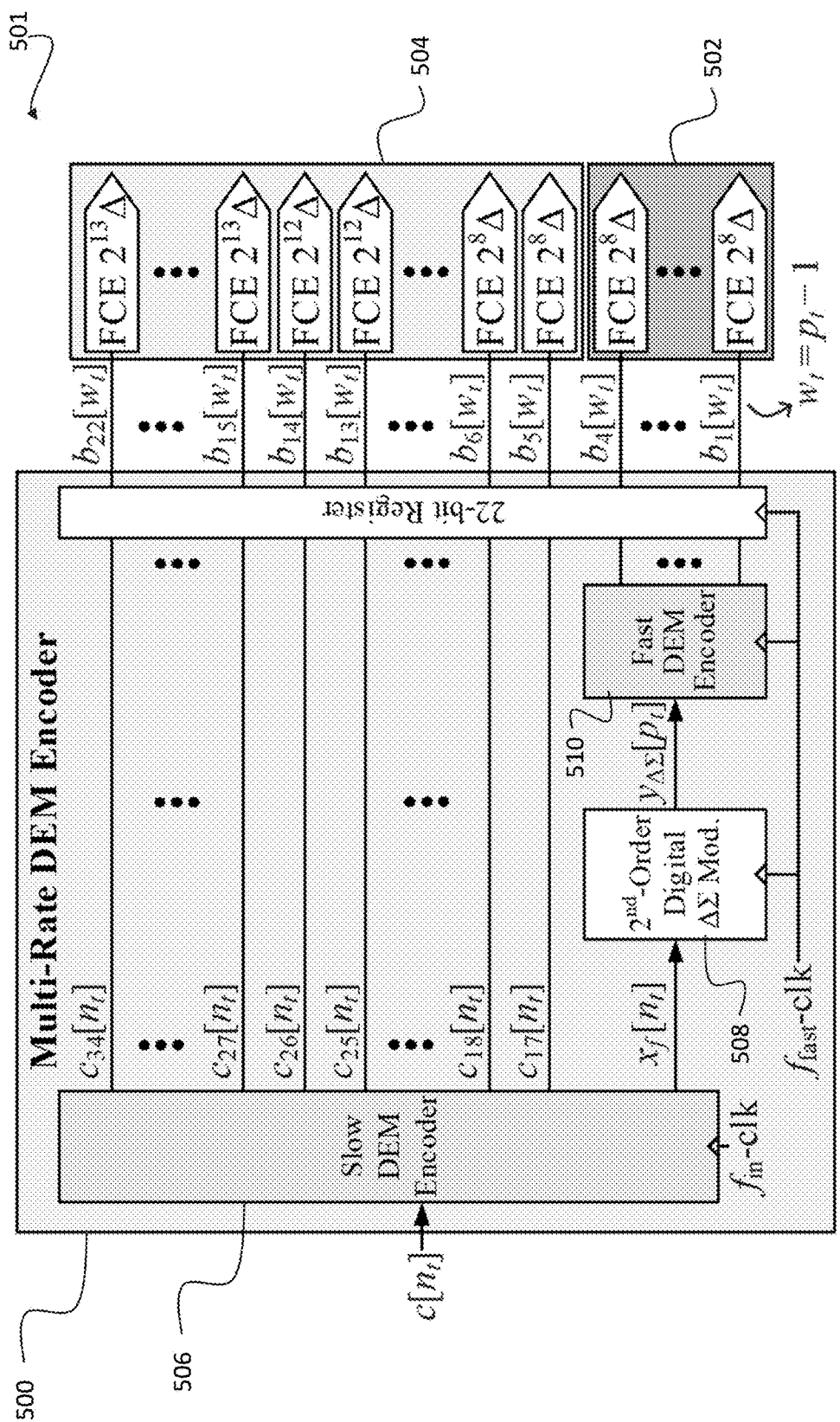
FIG. 5 is a block diagram of a preferred embodiment DCO with a multi-rate segmented DEM encoder that is a modification of the FIG. 3 encoder.
Figure 7:
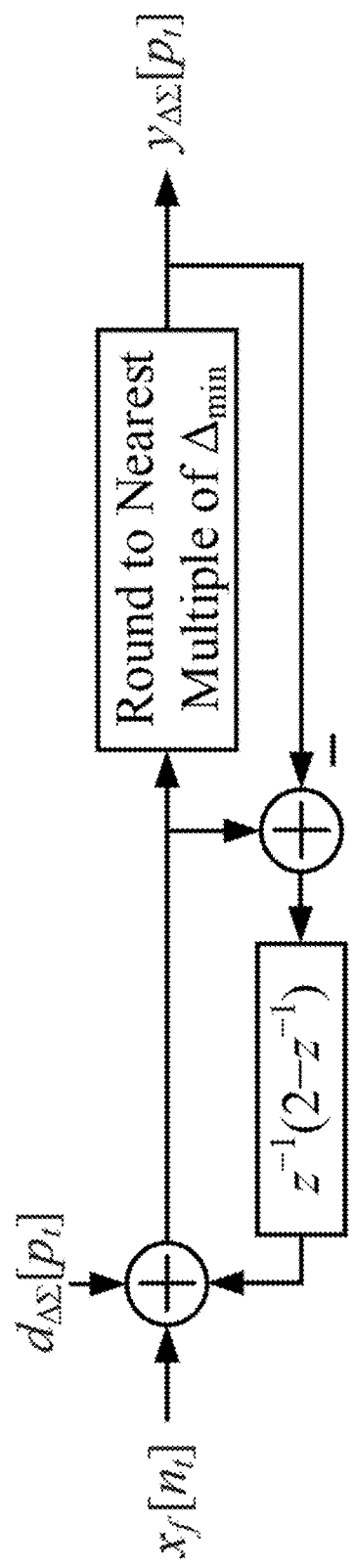
FIG. 7 is a functional diagram of a preferred embodiment second-order digital $\Delta\Sigma$ modulator used in FIG. 5.

As shown in FIG. 5, $x_f[n_t]$ is sampled at a rate of $f_{fast}$ by the second-order digital $\Delta\Sigma$ modulator 508, whose functional diagram is shown in FIG. 7. The dither sequence, $d_{\Delta\Sigma}[p_t]$, is generated such that it can be well-modeled as a two-level white random sequence that is independent of $d[n_t]$ and $x_f[n_t]$ and takes on values of 0 and $\Delta$ with equal probability. It ensures that the $\Delta\Sigma$ modulator's 508 quantization noise is asymptotically independent of $x_f[n_t]$ and $d_{\Delta\Sigma}[p_t]$, and has a PSD equal to that of the output of a filter with transfer function $(1-z^{-1})^2$ driven by white noise with a variance of $\Delta_{min}^2/12$. See, S. Pamarti, J. Welz, and I. Galton, "Statistics of the Quantization Noise in 1-Bit Dithered Single-Quantizer Digital Delta-Sigma Modulators," *IEEE Trans. Circuits Syst. I, Reg. Papers*, vol. 54, no. 3, pp. 492-503, March 2007. The $\Delta\Sigma$ modulator output is quantized to values in the set $\{-2\Delta_{min}, -\Delta_{min}, 0, \Delta_{min}, 2\Delta_{min}\}$ and is given by $$y_{\Delta\Sigma}[p_t]=x_f[n_t]+e_{\Delta\Sigma}[p_t], \quad (23)$$

where $e_{\Delta\Sigma}[p_t]$ is second-order highpass-shaped quantization noise plus $d_{\Delta\Sigma}[p_t]$.

In FIG. 5, a fast DEM encoder 510 can be a conventional mismatch-shaping non-segmented DEM encoder with a clock rate of $f_{fast}$. It is implemented as a tree of non-segmenting SBs, and it maps $y_{\Delta\Sigma}[p_t]$ to four 1-bit sequences, each of which drives an FCE with a frequency step size of $\Delta_{min}$.

Each $b_i[w_t]$ in FIG. 5, for i=1, 2, 3, 4, is clocked at a rate of $f_{fast}$ and toggles rapidly enough such that the FCE frequency transitions from the fractional FCE bank introduce high-frequency error components to the DCO phase error. Such components are lowpass filtered by the DCO, so $f_{fast}$ can be chosen so that they are not a problem in practice. Consequently, the frequency transitions of the FCEs from the fractional FCE bank 502 are modeled as ideal, so that $f_i(t)$ is given by (11) for i=1, 2, 3, 4.

It follows that $$f_F(t)=\alpha_F y_{\Delta\Sigma}[w_t]+e_F(t), \quad (24)$$

where $\alpha_F$ is the average of $\alpha_i$ for i=1, 2, 3, 4 and $e_F(t)$ is a function of the errors introduced by the fractional FCE bank 502 and the switching sequences from the fast DEM encoder 510. The fast DEM encoder 510 ensures that $e_F(t)$ is free of nonlinear distortion, uncorrelated with $y_{\Delta\Sigma}[w_t]$, and has a first-order highpass-shaped PSD that peaks at $f_{fast}/2$, so $f_{fast}$ can be chosen so that this term is not a problem in practice. Thus, substituting (23) into (24) and neglecting $e_F(t)$ gives $$f_F(t) = \alpha_F x_f[g(w_t)] + \alpha_F e_{\Delta\Sigma}[w_t]. \quad (25)$$

As shown in FIG. 5, the $c_{17}[n_t]$, $c_{18}[n_t]$, ..., $c_{34}[n_t]$ outputs of the slow DEM encoder 506 drive the same FCEs as those of the DEM encoder of FIG. 3. This implies that $f_I(t)$ is given by $$f_I(t) = \alpha_I(t) d[g(w_t)] + \gamma_I(t) d[g(w_t - 1)] + e_I(t), \quad (26)$$

where $$e_I(t) = \Delta \sum_{k,r} \{\alpha_{k,r}(t) s_{k,r}[g(w_t)] + \gamma_{k,r}(t) s_{k,r}[g(w_t - 1)]\}, \quad (27)$$

$\alpha_I(t)$, $\gamma_I(t)$, $\alpha_{k,r}(t)$ and $\gamma_{k,r}(t)$ (defined in Appendix A below) are $T_{fast}$-periodic waveforms that depend on the errors introduced by the integer FCE bank 504, and the summation indices indicate the summation over all k and r values corresponding to the SBs within the slow DEM encoder 506.

The contribution to the DCO frequency from both FCE banks 502 and 504 is $f_{tune}(t) = f_I(t) + f_F(t)$, so (25) and (26) imply that $$f_{tune}(t) = \alpha_I(t) d[g(w_t)] + \gamma_I(t) d[g(w_t-1)] + \alpha_F e_{\Delta\Sigma}[w_t] + e_M(t), \quad (28)$$

where $$e_M(t) = e_I(t) + \alpha_F x_f[g(w_t)] \quad (29)$$

is called FCE mismatch error. $e_M(t)$ is a linear combination of the switching sequences from the slow DEM encoder whose coefficients depend on the errors introduced by both FCE banks 502 and 504.

The $\gamma_I(t) d[g(w_t-1)]$ term in (28) is proportional to a $T_{fast}$-delayed version of $d[g(w_t)]$, so it represents a linear filtering operation. This term tends to be much smaller than the desired signal component, $\alpha_I(t) d[g(w_t)]$, so it is not a problem in practice. The $\alpha_F e_{\Delta\Sigma}[w_t]$ term is proportional to $\Delta\Sigma$ quantization noise plus dither so it is free of nonlinear distortion, is uncorrelated with the other terms in (28), and has a highpass-shaped PSD. The $e_M(t)$ term also has these properties because it is a linear combination of the switching sequences from the slow DEM encoder. The PSD of $\alpha_F e_{\Delta\Sigma}[w_t]$ peaks at $f_{fast}/2$, whereas the PSD of $e_M(t)$ peaks at $f_{in}/2$. Hence, $f_{fast}$ can be increased to make the DCO phase error introduced by $\alpha_F e_{\Delta\Sigma}[w_t]$ negligible, but this would not reduce the DCO phase error contribution from $e_M(t)$. Therefore, $e_M(t)$ is the only problematic term in (28).

Substituting (22) and (27) into (29) yields $$e_M(t) = \Delta \sum_{k,r} \{\delta_{k,r} s_{k,r}[g(w_t)] + \gamma_{k,r}(t)(s_{k,r}[g(w_t-1)] - s_{k,r}[g(w_t)])\}, \quad (30)$$

where

-continued $$\delta_{k,r} = \begin{cases} \alpha_{k,r}(t) + \gamma_{k,r}(t) + \alpha_F 2^{16-k}, & \text{if } k \geq 9, r = 1 \\ \alpha_{k,r}(t) + \gamma_{k,r}(t), & \text{otherwise} \end{cases}, \quad (31)$$

is constant for each k and r, even though neither $\alpha_{k,r}(t)$ nor $\gamma_{k,r}(t)$ are constant. The non-constant terms in each $\alpha_{k,r}(t)$ are equal in magnitude but opposite in sign to the corresponding terms in $\gamma_{k,r}(t)$, so $\alpha_{k,r}(t) + \gamma_{k,r}(t)$, and hence $\delta_{k,r}$, are constant. Therefore, the terms proportional to $\delta_{k,r}$ in (30) represent the DCO frequency error contribution from FCE static gain errors, whereas the terms proportional to $\gamma_{k,r}(t)$ in (30) represent the DCO frequency error contribution from non-ideal FCE frequency transitions.

Adaptive FCE Mismatch Noise Cancellation

The purpose of the present MNC is to cancel most of the DCO phase error that would otherwise be caused by $e_M(t)$. To do this, the sequence $$e_{MNC}[p_t] = \Delta \sum_{k,r} \{a_{k,r} s_{k,r}[n_t] + b_{k,r}(s_{k,r}[g(w_t)] - s_{k,r}[n_t])\}, \quad (32)$$

where $a_{k,r}$ and $b_{k,r}$ are called the MNC coefficients, is injected into the fractional path of the multi-rate DEM encoder. The ideal MNC coefficient values, i.e., the values of $a_{k,r}$ and $b_{k,r}$ for which the DCO phase error contribution of $e_M(t)$ is minimized, are estimated with a least-mean-square (LMS)-like algorithm. The algorithm is similar to a conventional LMS algorithm in the sense that it consists of a set of coefficients that are updated over time based on how strongly known signals are correlated to an error measurement.

We next explain how $e_{MNC}[p_t]$ affects the DCO's phase error, how the FCE mismatch error is measured, and how the MNC coefficients are adaptively computed from the FCE mismatch error measurement.

MNC Sequence Application

Figure 8:
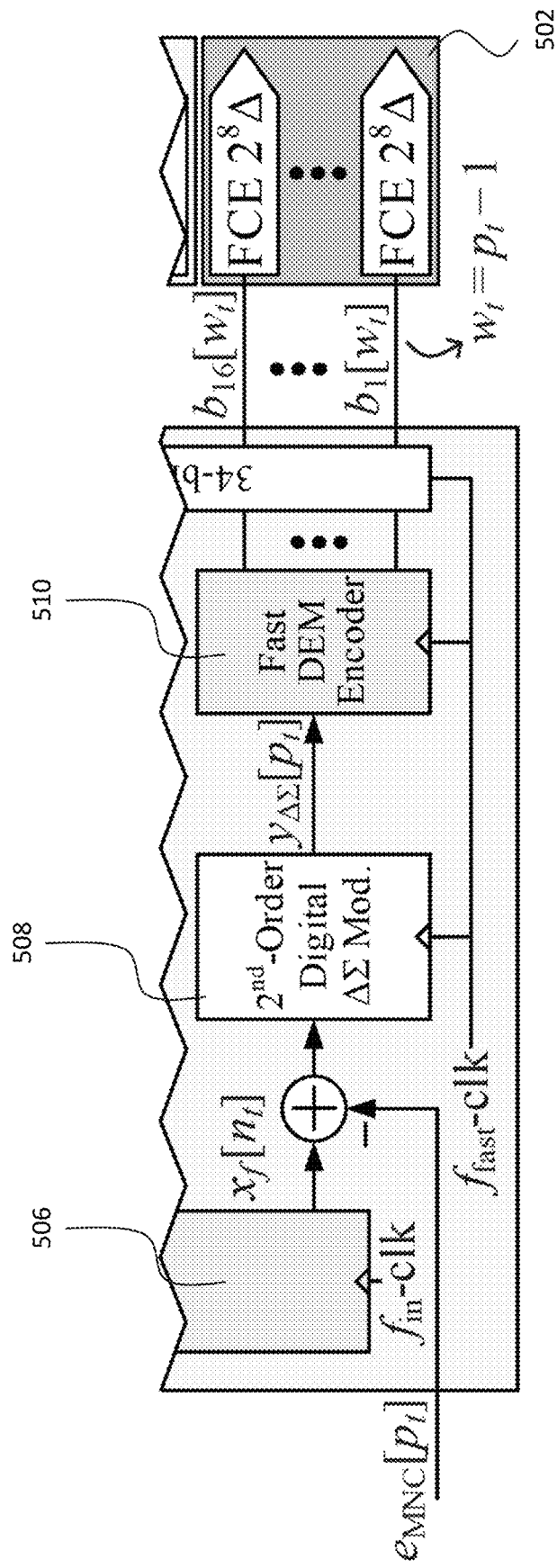
FIG. 8 shows the fractional path of the multi-rate DEM encoder shown in FIG. 5 modified to accommodate MNC.

FIG. 8 shows the fractional path of the multi-rate DEM encoder shown in FIG. 5 modified to accommodate MNC. The $e_{MNC}[p_t]$ sequence (determined by FIGS. 11A-11C, discussed below) is subtracted from $x_f[n_t]$ prior to the $\Delta\Sigma$ modulator, and the output range of the $\Delta\Sigma$ modulator 508, the range of the fast DEM encoder 510, and the number of FCEs of the FCE bank 502 driven by the fast DEM encoder 510 are all four times those of the original FIG. 5 system to accommodate the resulting dynamic range increase. Thus, $f_F(t)$ is still given by (24), but now $y_{\Delta\Sigma}[p_t]$ is given by the right side of (23) minus $e_{MNC}[p_t]$. Despite having the same qualitative properties as before, $\alpha_F$ and $e_F(t)$ in (24) are slightly different in the modified system because of the additional FCEs.

An analysis shows that $f_{tune}(t)$ is now given by $$f_{tune}(t) = \alpha_I(t) d[g(w_t)] + \gamma_I(t) d[g(w_t-1)] + \alpha_F e_{\Delta\Sigma}[w_t] + e_R(t), \quad (33)$$

where $$e_R(t) = e_M(t) - \alpha_F e_{MNC}[w_t] \quad (34)$$

is the residual FCE mismatch error, i.e., what is left of $e_M(t)$ when $e_{MNC}[p_t]$ is applied. It follows from (30), (32) and (34) that $$e_R(t) = \qquad (35)$$

$$\Delta \sum_{k,r} \{\delta_{k,r-res} s_{k,r}[g(w_t)] + \gamma_{k,r-res}(t)(s_{k,r}[g(w_t-1)] - s_{k,r}[g(w_t)])\},$$

respectively.

Given that $\delta_{k,r}$ is constant, there exists an $a_{k,r}$ that causes $\delta_{k,r-res}=0$. In contrast, there is no $b_{k,r}$ that causes $\gamma_{k,r-res}(t)$ to vanish completely, because $\gamma_{k,r}(t)$ is not constant. However, $\gamma_{k,r}(t)$ is $T_{fast}$-periodic so there exists a $b_{k,r}$ that makes the DC component of $\gamma_{k,r-res}(t)$ zero, such that $\gamma_{k,r-res}(t)$ is a linear combination of sinusoids with frequencies that are non-zero multiples of $f_{fast}$. Therefore, it follows from Error! Reference source not found. that if $$a_{k,r} = \frac{\delta_{k,r}}{\alpha_F} \text{ and } b_{k,r} = \frac{1}{\alpha_F T_{fast}} \int_0^{T_{fast}} \gamma_{k,r}(\tau) d\tau, \qquad (36)$$

for each k and r, then $$\delta_{k,r-res}=0 \text{ and } \int_0^{T_{fast}} \gamma_{k,r-res}(\tau) d\tau = 0. \qquad (37)$$

In the absence of FCE static mismatches, $a_{k,r}=0$, and if the FCE frequency transitions are ideal, $b_{k,r}=0$.

Phase error is the integral of frequency error, so the DCO phase error introduced by $e_R(t)$ is given by $$\theta_R(t) = \int_0^t e_R(\tau) d\tau. \qquad (38)$$

If (37) is satisfied, then (35) and (38) imply that $$\theta_R(t) = \Delta \sum_{k,r} (s_{k,r}[g(w_t-1)] - s_{k,r}[g(w_t)]) \int_0^{t-p_t T_{fast}} \gamma_{k,r-res}(u) du, \qquad (39)$$

where $t-p_t T_{fast}=t-\lfloor f_{fast} t \rfloor T_{fast} < T_{fast}$. The term within the parenthesis in (39) equals zero when $g(w_t)-g(w_t-1)=0$ and $s_{k,r}[g(w_t)-1] - s_{k,r}[g(w_t)]$ otherwise. Given that $g(w_t)-g(w_t-1)$ can only take on values from the set $\{0, 1\}$, then $$s_{k,r}[g(w_t-1)] - s_{k,r}[g(w_t)] = (g(w_t)-g(w_t-1))(s_{k,r}[g(w_t)-1] - s_{k,r}[g(w_t)]). \qquad (40)$$

Furthermore, $g(w_t)$ is a $T_{fast}$-delayed version of $n_t$, which increases by one unit every $T_{in}=1/f_{in}$, so $g(w_t)-g(w_t-1)$ is $T_{in}$-periodic and is given by $$g(w_t) = g(w_t - 1) = \sum_{k=-\infty}^{\infty} r(t - kT_{in}), \qquad (41)$$

where $r(t)=1$ for $t \in [T_{fast}, 2T_{fast})$ and 0 otherwise. It follows from (41) that the Fourier expansion of $g(w_t)-g(w_t-1)$ is $$\frac{f_{in}}{f_{fast}} + \sum_{m=1}^{\infty} \frac{2}{m\pi} \sin\left(m\pi \frac{f_{in}}{f_{fast}}\right) \cos\left(2\pi m f_{in}\left[t - \frac{3}{2}T_{fast}\right]\right). \qquad (42)$$

Thus, if the conditions shown in (37) are satisfied, (39), (40) and (42) imply that $\theta_R(t)$ would be given by second-order shaped noise multiplied by a $T_{in}$-periodic waveform and a DC-free $T_{fast}$-periodic waveform. Consequently, $e_R(t)$ would introduce components with frequencies around $f_{n,m}=nf_{fast} \pm mf_{in}$ to the DCO's phase error, where $n=1, 2,$ 3, ... and $m=0, 1, 2, \ldots$. It follows from (42) that the power of the components around frequencies $f_{n,m}$ with m near multiples of $f_{fast}/f_{in}$ is very low. Therefore, $\theta_R(t)$ would not be a problem if $f_{fast}$ is large enough because $e_R(t)$ would only introduce high-frequency components to the DCO's phase error that would be lowpass filtered by the DCO. Simulation results also suggest that $\theta_R(t)$ is not a problem provided the conditions shown in (37) are satisfied and $f_{fast}$ is large enough.

FCE Mismatch Error Measurement

The ideal MNC coefficient values are estimated as part of a feedback loop in a digital fractional-N PLL that incorporates the DCO. This is done during the PLL's normal operation by adaptively adjusting $a_{k,r}$ and $b_{k,r}$ such that the conditions shown in (37) are satisfied for each k and r, thereby minimizing $e_R(t)$.

Figure 9:
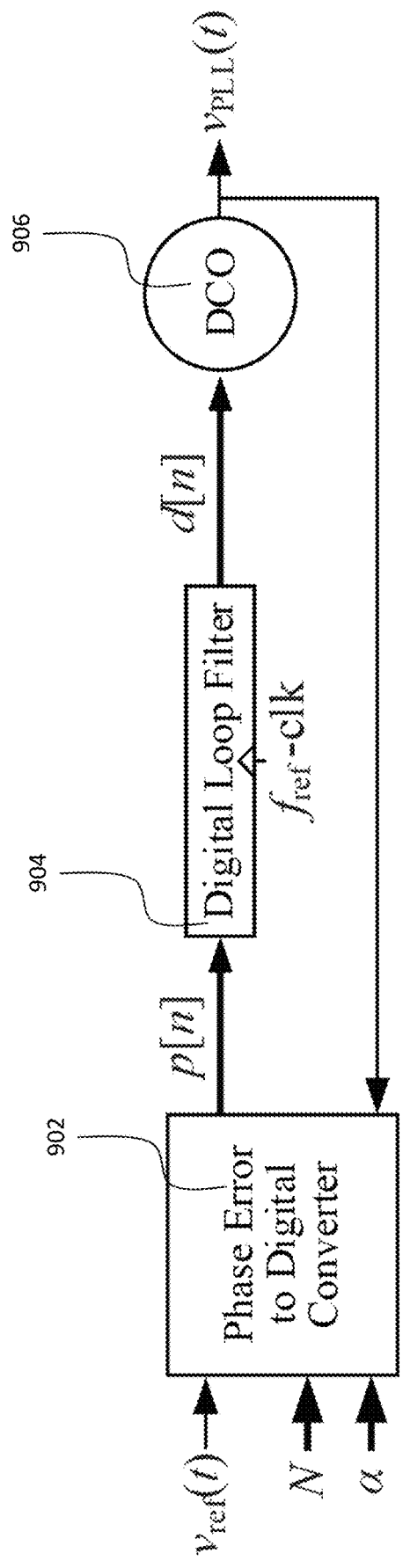
FIG. 9 (Prior Art) is a schematic diagram of a digital fractional-N PLL without MNC.

The purpose of a fractional-N PLL is to generate a periodic output signal, $v_{PLL}(t)$, with frequency $f_{PLL}=(N+\alpha)f_{ref}$ where N is a positive integer, $\alpha$ is a fractional value and $f_{ref}$ is the frequency of a reference oscillator waveform, $v_{ref}(t)$. The general form of a digital fractional-N PLL without MNC is shown in FIG. 9. It consists of a phase-error-to-digital converter (PEDC) 902, a lowpass digital loop filter (DLF) 904, and a DCO 906. The PEDC's 902 output is an $f_{ref}$-rate digital sequence of the form $$p[n] = -\theta_{PLL}[n] + e_p[n], \qquad (43)$$

where $\theta_{PLL}[n]$ is an estimate of the PLL's phase error and $e_p[n]$ is additive error that includes quantization error from the PEDC's 902 digitization process as well as error from circuit noise and other non-ideal circuit behavior in both the PEDC and reference oscillator.

Figure 10A:
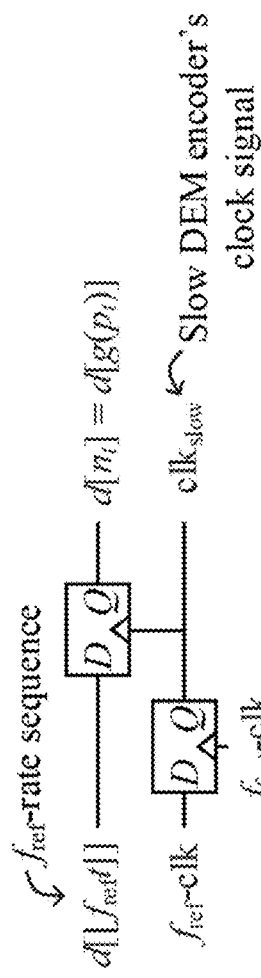
FIGS. 10A & 10B (Prior Art) respectively are a schematic diagram of a synchronization circuit used at DCO input in FIG. 9 and illustration of the clock signals within the DCO, $p_t$, and $n_t=g(p_t)$ for $f_{fast}=4.5f_{ref}$.
Figure 10B:
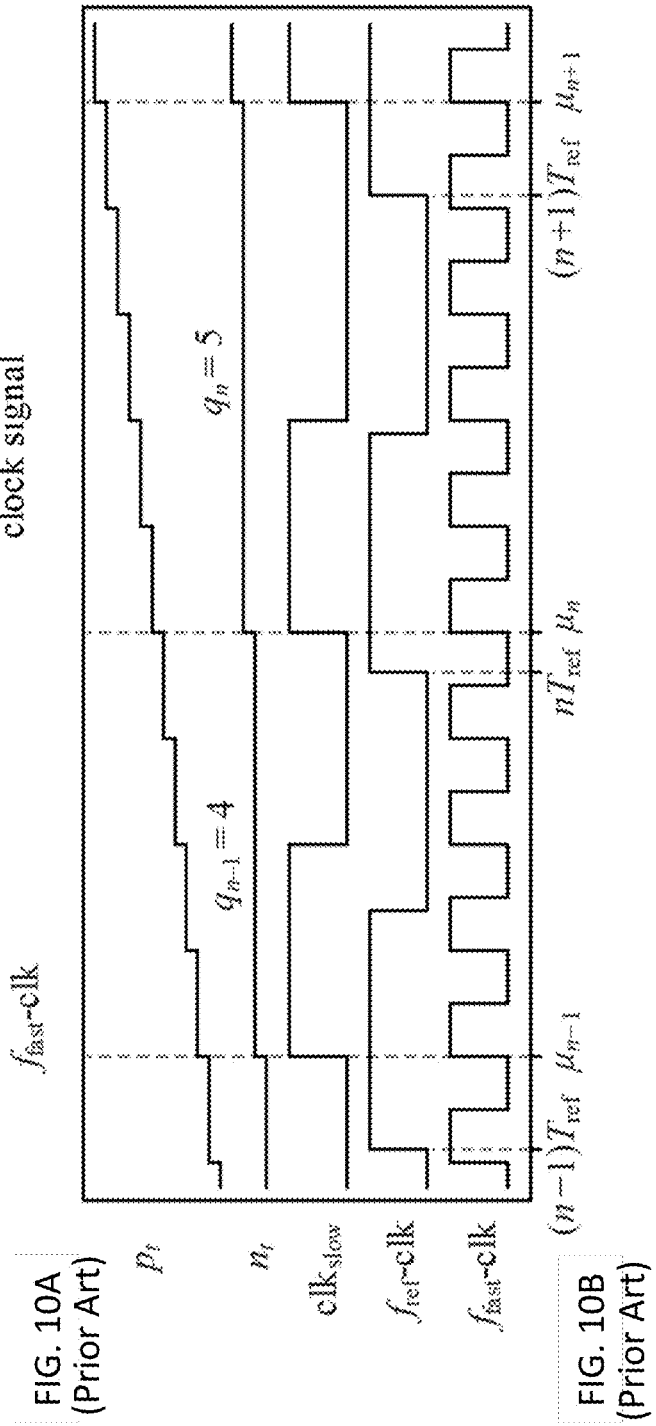

A modified version of the DCO 906 contains the preferred multi-rate DEM structure of FIG. 5 with the MNC correction of FIG. 8 with $f_{in}=f_{ref}$. Typically, $f_{fast}$-clk is a divided-down version of $v_{PLL}(t)$. Given that $f_{PLL}=(N+\alpha)f_{ref}$, $f_{ref}$ and $f_{fast}$ are incommensurate frequencies when $\alpha \neq 0$, it is not possible for $n_t$ to change synchronously with $p_t = \lfloor f_{fast} t \rfloor$ if $n_t = \lfloor f_{ref} t \rfloor$. Therefore, as shown in FIGS. 10A & 10B, in practice the DCO input is synchronized to $f_{fast}$-clk so (4) is satisfied, i.e., so $n_t$ only changes at times $\mu_n$, which are multiples of $T_{fast}$, instead of times $nT_{ref}$, where $T_{ref}=1/f_{ref}$ is the reference period. It is common practice in digital PLLs to synchronize the DLF 904 output to the clock signal of the fractional path, so this is not a special requirement of the proposed system. A conventional circuit to avoid metastability issues is also needed as part of the synchronization circuit shown in FIG. 10A, but it has been omitted for simplicity.

A requirement of a PLL is to suppress low-frequency DCO error, which is achieved by subjecting additive frequency error introduced by the DCO to a highpass filter that has at least one zero at DC. In the following, the impulse response of this filter is denoted as h[n], and its running sum, i.e., h[0]+h[1]+ . . . +h[n], is denoted as l[n]. p[n] can be written as $$p[n] = p_{ideal}[n] + p_R[n], \qquad (44)$$

where $p_{ideal}[n]$ represents the contribution to p[n] of all noise sources except FCE mismatches and $p_R[n]$ is the contribution to p[n] from $e_R(t)$. Specifically, $p_R[n]$ (with references to definitions in Appendix B) is given by $$p_R[n] = \Delta \alpha_F T_{fast} \sum_{i=0}^{n-1} \sum_{k,r} \{y_{k,r-a}[i] + y_{k,r-b}[i]\} l[n-1-i], \qquad (45)$$

where $y_{k,r-a}[t]+y_{k,r-b}[i]$ is proportional to the PLL's frequency error introduced by the $s_{k,r}[n]$ sequences. If $a_{k,r}$ and $b_{k,r}$ in (32) are replaced by $a_{k,r}[n_t]$ and $b_{k,r}[n_t]$, respectively, then $$y_{k,r-a}[i]=(q_{i-1}-3)s_{k,r}[i-1]a_{k,r-error}[i-1]+3s_{k,r}[i]a_{k,r-error}[i] \quad (46)$$

and $$a_{k,r-b}[i]=(s_{k,r}[i-1]-s_{k,r}[i])b_{k,r-error}[i], \quad (47)$$

where $q_{i-1}$ is the number of $T_{fast}$ periods between times $\mu_{i-1}$ and $\mu_i$, and $$a_{k,r-error}[n]=a_{k,r}[n]-a_{k,r} \text{ and } b_{k,r-error}[n]=b_{k,r}[n]-b_{k,r} \quad (48)$$

are the MNC coefficient errors at sample time n.

The term proportional to $s_{k,r}[i]$ in (46) arises because the time at which the PEDC 902 samples the PLL's phase error, which is given by $\mu_n+4T_{fast}$ in the design example, is not equal to the time at which the integer FCE bank's inputs are updated, i.e., $\mu_n+T_{fast}$. Accordingly, the integer FCE bank's inputs are updated three $T_{fast}$ before the PLL's phase error is sampled, which causes $y_{k,r-a}[i]$ to depend on $s_{k,r}[i-1]$ and also on $s_{k,r}[i]$.

As implied by (44)-(47), the PEDC's 902 output has information regarding the MNC coefficient errors. The MNC coefficient estimation process described next is based on this result and on the properties of the switching sequences.

MNC Coefficients Estimation

A digital fractional-N PLL with the multi-rate DEM encoder and MNC technique is shown in FIG. 11A. The details of MNC logic 1102 are shown in FIG. 11B and FIG. 11C, wherein $$t_{k,r}[n]=\sum_{i=0}^{n}s_{k,r}[i] \quad (49)$$

is the running sum of $s_{k,r}[n]$, and $K_a$ and $K_b$ are called the MNC gains. The MNC logic block consists of an adder and 25 $s_{k,r}[n_t]$ residue estimators 1104.

It follows from FIG. 4 that each $s_{k,r}[n]$ sequence is a concatenation of sequences of the form 1, 0, . . . , 0, −1, 0, . . . , 0 or −1, 0, . . . , 0, 1, 0, . . . , 0, where each 0 is present only when the input of the $s_{k,r}[n]$ generator is zero. Thus, $|s_{k,r}[n]| \le 1$, $|t_{k,r}[n]| \le 1$ and $|s_{k,r}[n]-s_{k,r}[n-1]| \le 2$ for all n, so the multipliers in FIG. 11(c) are simple in terms of hardware.

The $s_{k,r}[n_t]$ residue estimators 1104 are responsible for the computation of the MNC coefficients. At each sample time, the MNC coefficient errors are measured and $a_{k,r}[n_t]$ and $b_{k,r}[n_t]$ are updated such that they approach the values shown in (36). The measurement of the MNC coefficient errors is based on the statistical properties of the switching sequences.

Although each $s_{k,r}[n]$ sequence depends on the input of its corresponding SB, when it is non-zero, its sign depends on $d_{k,r}[n]$. Given that the $d_{k,r}[n]$ sequences are independent of the $d_{k,r}[n]$ sequences in the other SBs, this provides enough randomization for the $s_{k,r}[n]$ sequences to be uncorrelated with each other. Furthermore, as the $d_{k,r}[n]$ sequences are also independent of all electronic device noise sources in the PLL, each $s_{k,r}[n]$ sequence is uncorrelated with all such sources as well, and it is also uncorrelated with the PEDC's 902 quantization noise in PLLs where such noise source is uncorrelated with the PLL's phase error.

Hence, in such cases, the $s_{k,r}[n]$ sequences are uncorrelated with all PLL noise except the terms in p[n] arising from $e_R(t)$, i.e., $p_R[n]$.

The $y_{k,r-a}[i]$ and $y_{k,r-b}[i]$ terms in p[n] depend on the MNC coefficient errors, and such terms are proportional to functions of the $s_{k,r}[n]$ sequences. Specifically, it can be seen from (44)-(47) that p[n] has information about an accumulated version of $$(q_{n-2}-3)s_{k,r}[n-2]a_{k,r-error}[n-2], \quad (50)$$

and that p[n]−p[n−1] has information about $$(s_{k,r}[n-2]s_{k,r}[n-1])b_{k,r-error}[n-1]. \quad (51)$$

Therefore, it follows that the accumulator inputs in FIG. 11C, i.e., −p[n]$t_{k,r}$[n−2] and (p[n−1]−p[n])($s_{k,r}$[n−2]−$s_{k,r}$[n−1]), when non-zero, are noisy estimates of $a_{k,r-error}[n]$ and $b_{k,r-error}[n]$, respectively, so they can be used to adaptively compute the ideal MNC coefficients. In practice, the top and bottom branches within each $s_{k,r}[n_t]$ residue estimator 1104 interfere with each other in a way that makes the accumulator inputs have information about both MNC coefficient errors. However, extensive simulations indicate that the MNC coefficient values converge to their ideal values regardless of such interferences provided the MNC gains are set properly to avoid instability in the feedback loops.

It would also be possible to correlate p[n−1]−p[n] by $s_{k,r}$[n−2] to get an estimate of $a_{k,r-error}[n]$. However, as $a_{k,r}[n]$ is only updated when the accumulator input is non-zero, correlating p[n−1]−p[n] against $s_{k,r}$[n−2] instead of −p[n] against $t_{k,r}$[n−2] would significantly decrease the convergence speed of $a_{k,r}[n]$ because normally $s_{k,r}$[n−2] is zero more often than $t_{k,r}$[n−2]. Although correlating −p[n] against $t_{k,r}$[n−2] effectively increases the error variance of $a_{k,r}[n]$, as explained next, this problem can be mitigated by reducing $K_a$.

As is common in most LMS-like algorithms, the choice of $K_a$ and $K_b$ represents a tradeoff. The larger the MNC gains, the faster the convergence, but the larger the error variance of $a_{k,r}[n]$ and $b_{k,r}[n]$. Also, as the $s_{k,r}[n_t]$ residue estimators comprise two LMS-like loops in parallel that interfere with each other, $K_a$ and $K_b$ each affect the convergence time and error variance of both $a_{k,r}[n]$ and $b_{k,r}[n]$. Although it might be possible to develop closed-form expressions that quantify these tradeoffs, the authors currently use simulations to assist the design process and to choose the values of $K_a$ and $K_b$.

Simulation Results

The multi-rate DEM and the MNC methods of the preferred embodiments described above were tested in an event-driven behavioral simulation of a modified version of the ΔΣ frequency-to-digital converter based fractional-N PLL presented in [C. Weltin-Wu, G. Zhao, and I. Galton, "A Highly-Digital Frequency Synthesizer Using Ring-Oscillator Frequency-to-Digital Conversion and Noise Cancellation," *IEEE International Solid-State Circuits Conf.*, pp. 1-3, February 2015; C. Weltin-Wu, G. Zhao, and I. Galton, "A 3.5 GHz Digital Fractional-N Frequency Synthesizer Based on Ring Oscillator Frequency-to-Digital Conversion," *IEEE J. Solid-State Circuits*, vol. 50, no. 12, pp. 2988-3002, December 2015]. As explained in [C. Weltin-Wu, E. Familier, and I. Galton, "A Linearized Model for the Design of Fractional-N PLLs based on Dual-Mode Ring Oscillator FDCs,"*IEEE Trans. Circuits Syst. I, Reg. Papers*, vol. 62, no. 8, pp. 2013-2023, August 2015], p[n] is given by (43) where $e_p[n]$ is first-order shaped quantization noise that is uncorrelated with the PLL's phase error plus error from both the PEDC and reference oscillator.

The DLF consists of two single-pole IIR stages and a proportional-integral stage. Its transfer function is $$L(z) = K_M \left(K_P + \frac{K_I}{1 - z^{-1}}\right) \prod_{i=0}^{1} \frac{\lambda_i}{1 - (1 - \lambda_i)z^{-1}}, \quad (52)$$

where $K_M$, $K_P$, $K_I$, $\lambda_0$ and $\lambda_1$ are constant loop filter parameters. The DCO consists of an LC oscillator core with a power-of-two-weighted coarse capacitor bank, an integer FCE bank 502 and a fractional FCE bank 504 in accordance with FIG. 5. The latter two are driven by the multi-rate DEM encoder 500 shown in FIG. 5 and modified as shown in FIG. 8 with $f_{fast}=f_{PLL}/8$ and $\Delta_{min}=40$ kHz (i.e., $\Delta=156.25$ Hz).

Figure 12:
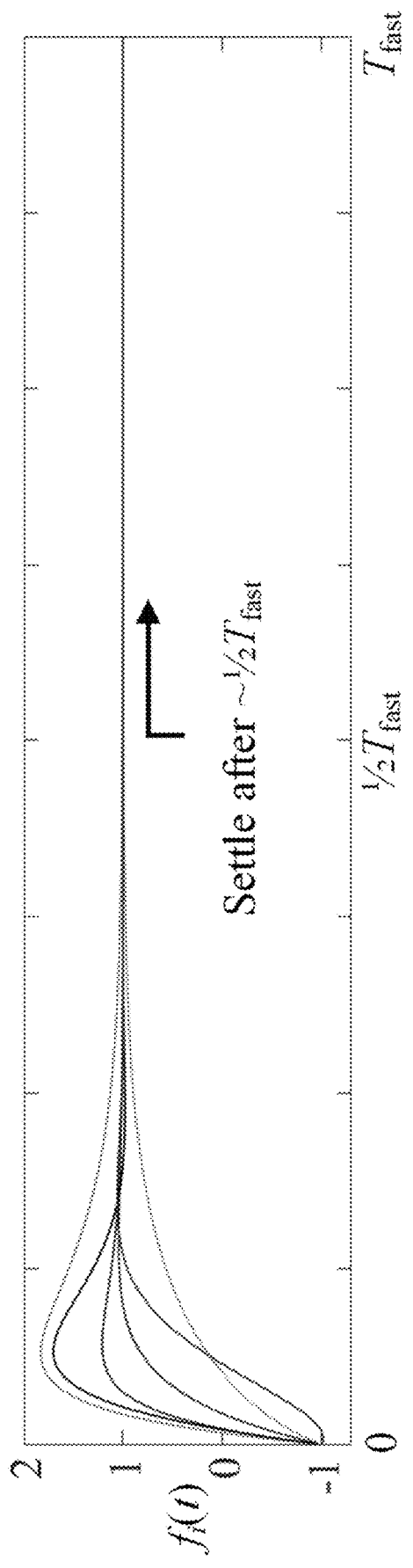
FIG. 12 shows example frequency transients used in a simulation of the FIGS. 11A-11C digital fractional-N PLL.

The static gain error of the ith FCE was modeled as an additive zero-mean Gaussian random variable with a standard deviation of 5% of $\Delta_i$ divided by the square root of $\Delta_i/\Delta_{min}$. The FCE frequency transitions were modeled as second-order transients that settle within one $T_{fast}$ period. The parameters of these transients, such as the damping factor and the natural frequency, are modelled as random variables with means and standard deviations determined from transistor-level simulation results. FIG. 12 shows example frequency transients used in the simulation.

The simulated noise parameters of the DCO and the reference oscillator, as well as the PEDC internal parameters were $f_{ref}=26$ MHz, $N=134$ and $\alpha=0.0003846153$, so that $f_{PLL}=3.484$ GHz and $f_{fast}=435.5$ MHz. The DLF parameters used were $K_M=1.25$, $K_P=2^4$, $K_I=2^{-4}$, $\lambda_0=2^{-3}$ and $\lambda_1=2^{-2}$, and the MNC gains were set to $K_a=2^{-3}$ and $K_b=2^{-5}$. The simulated PLL has a bandwidth of 206 kHz and a phase margin of 63 degrees.

Figure 13A:
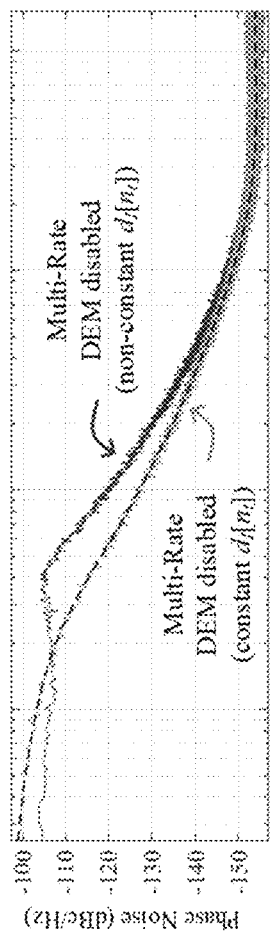
FIGS. 13A-13C respectively show simulated phase noise of the FIGS. 11A-11C digital fractional-N PLL; with the multi-rate DEM technique disabled, with the multi-rate DEM technique enabled for two cases, and with the multi-rate DEM technique enabled and with the MNC technique disabled and enabled.

FIG. 13A shows the simulated PLL phase noise PSD with the multi-rate DEM technique disabled, i.e., with the flip-flops in both the slow and fast DEM encoders frozen. The two curves in FIG. 13A were obtained from two different simulations: one in which $d_r[n_r]$ is constant and another one in which $d_r[n_r]$ changes frequently. Although the DCO input sequence does not vary significantly in the short term once the PLL is locked, its moving average drifts over time such that $d_r[n_r]$ eventually begins to change frequently, at which point it degrades the PLL's phase noise as shown in FIG. 13A. Once the multi-rate DEM technique is enabled, whether or not $d_r[n_r]$ changes has no significant effect on the DCO's frequency, so spectral breathing no longer occurs.

Figure 13B:
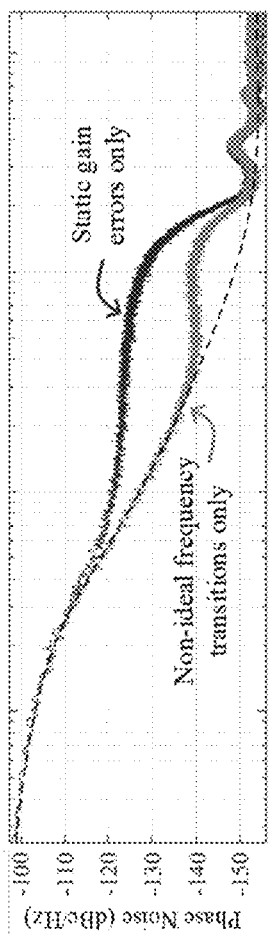
Figure 13C:
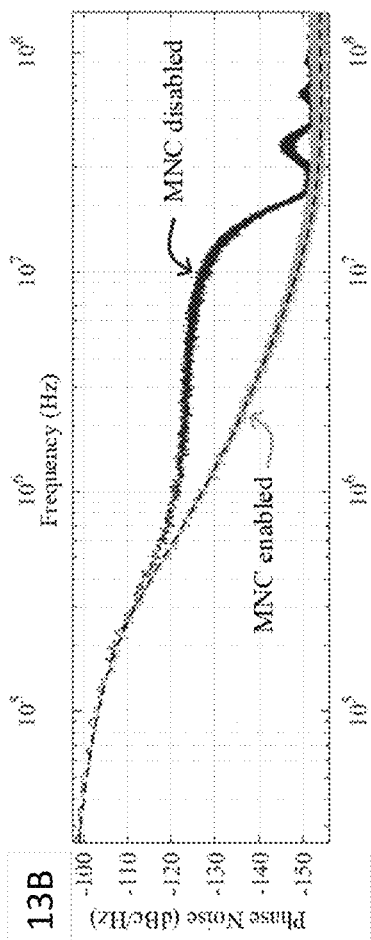

FIG. 13B shows the simulated PLL phase noise PSD with the multi-rate DEM technique enabled for two cases: one case with just static gain errors, and the other case with just non-ideal frequency transitions. FIG. 13C shows the simulated PLL phase noise PSD considering both sources of error with the multi-rate DEM technique enabled and with the MNC technique disabled and enabled. The theoretical PLL phase noise PSD for ideal FCEs, which was computed using the linearized model presented in [C. Weltin-Wu, E. Familier, and I. Galton, "A Linearized Model for the Design of Fractional-N PLLs based on Dual-Mode Ring Oscillator FDCs,"*IEEE Trans. Circuits Syst. I, Reg. Papers*, vol. 62, no. 8, pp. 2013-2023, August 2015], is also plotted as the dashed curves in FIGS. 13A-13C to provide a comparison baseline.

As shown in FIG. 13A, when the MNC technique is enabled the resulting phase noise PSD matches the theoretically-predicted phase noise PSD for ideal FCEs after $13 \cdot 10^7$ reference periods (5 seconds) from a cold start. This implies a phase noise improvement of more than 20 dB at an offset frequency around 10 MHz. As the FCE mismatches are mostly determined by circuit component mismatches, they are not expected to change significantly over time. Hence, once obtained, the MNC coefficients can be stored in memory and used subsequently by the PLL, thereby avoiding future convergence time delays.

Figure 14A:
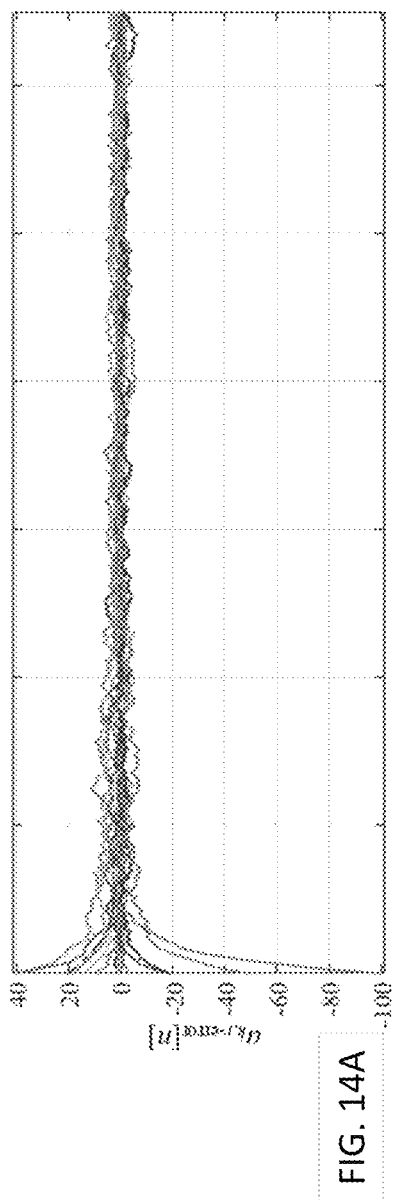
FIGS. 14A & 14B show the evolution of the MNC coefficient errors over time from the simulation used to generate the curves in FIG. 13C.
Figure 14B:
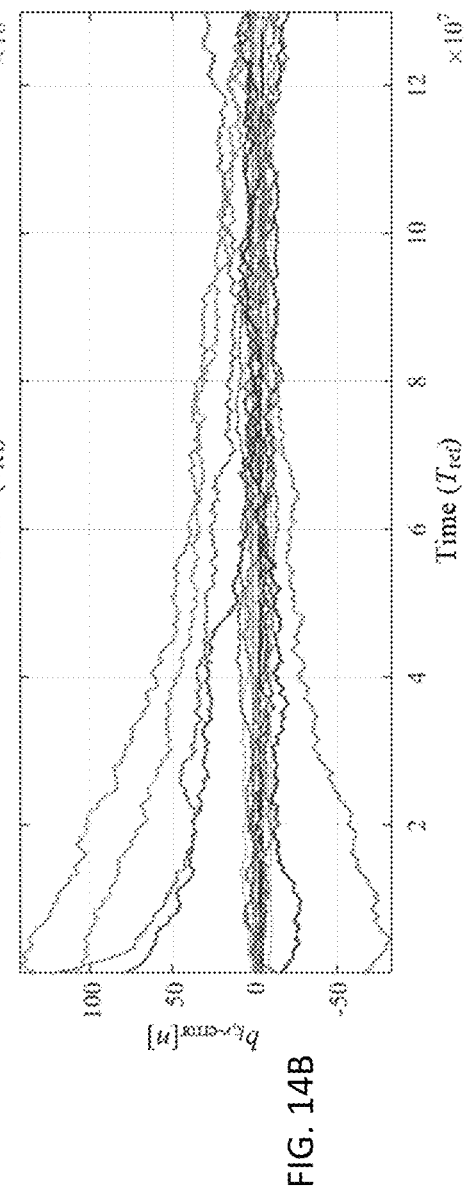

FIG. 14 shows the evolution of the MNC coefficient errors over time from the simulation used to generate the curves in FIG. 13C. As shown in FIG. 14, some $b_{k,r}[n]$ coefficients initially move away from their ideal values. As explained above, this happens because the top and bottom branches of each $s_{k,r}[n_r]$ residue estimator interfere with each other so that the error estimate at the input of each accumulator is biased by the MNC coefficient error of the opposite branch. If the MNC gains are set as in FIGS. 14A and 14B, this is not a problem because this effect becomes less significant as either one or both MNC coefficients approach their ideal values.

It follows from (46) and (47) that the terms proportional to $a_{k,r\text{-}error}[n]$ in p[n] are $q_n$-3 times larger than those proportional to $b_{k,r\text{-}error}[n]$ (e.g., $q_n \cong 16$ in the design example), so for $K_a = K_b$, the error variance of each $b_{k,r}[n]$ is expected to be larger than that of $a_{k,r}[n]$. Therefore, in order to make the error variance of the $b_{k,r}[n]$ coefficients comparable to that of the $a_{k,r}[n]$ coefficients, $K_b$ has to be smaller than $K_a$. As shown in FIGS. 14A & 14B, this causes the $b_{k,r}[n]$ coefficients to converge to their ideal values at a slower rate than the $a_{k,r}[n]$ coefficients, so the convergence speed of the MNC technique is limited by $K_b$. Nonetheless, it follows from FIGS. 14A & 14B that the $a_{k,r}[n]$ coefficients get close to their ideal values in less than $10^7$ reference periods (~0.4 seconds). Hence, as the most significant sources of phase noise are the FCE static gain errors, the MNC method allows for a considerable phase noise improvement in less than half a second.

Figure 15A:
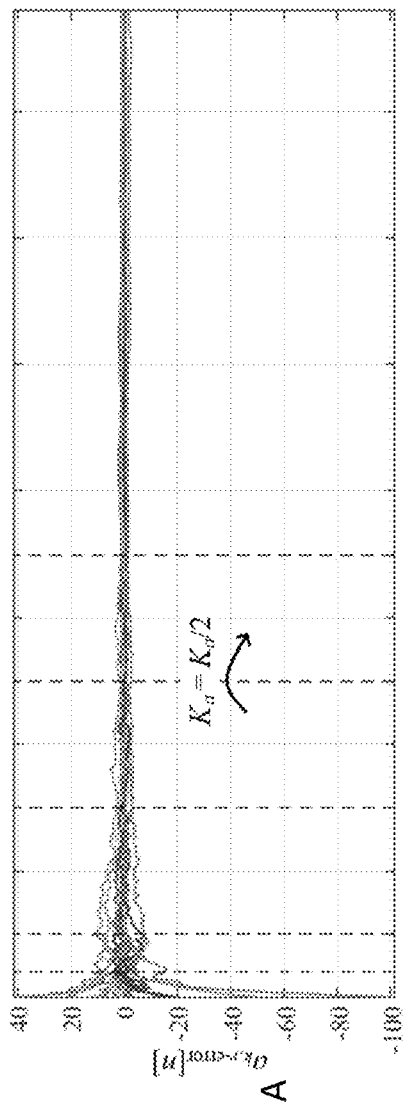
FIGS. 15A & 15B show the evolution of the MNC coefficient errors over time for $7.8 \cdot 10^7$ reference periods (3 seconds) for an example case in which $K_a$ and $K_b$ are initially set to $2^{-1}$ and $2^{-2}$, respectively, and then divided by two at the times indicated by the vertical dashed lines.
Figure 15B:
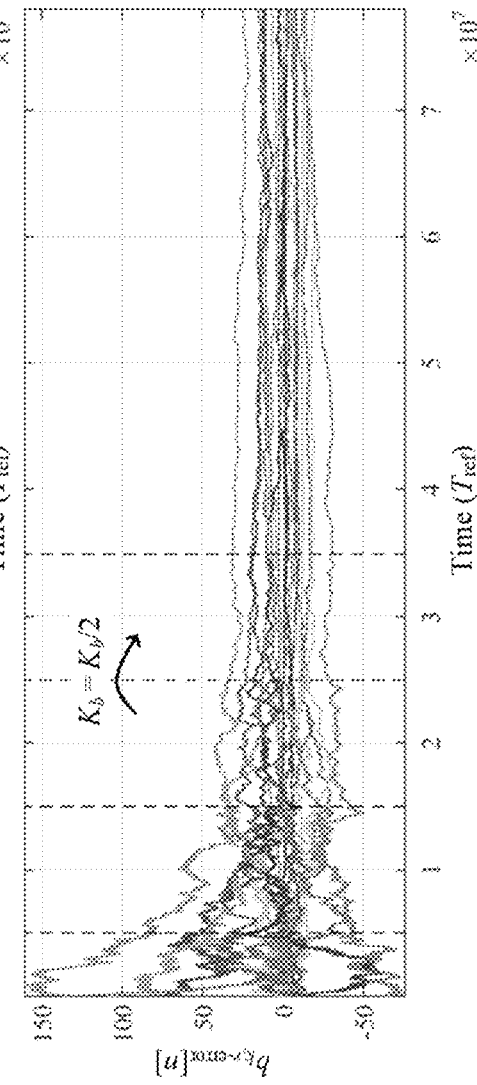

To reduce the cold-start convergence time of the MNC technique, large MNC gains can be used initially and decreased over time. See, W. Y. Chen and R. A. Haddad, "A Variable Step Size LMS Algorithm," *Proc. 33rd Midwest Symp. Circuits and Systems*, pp. 423-426, August 1990. FIGS. 15A and 15B shows the evolution of the MNC coefficient errors over time for $7.8 \cdot 10^7$ reference periods (3 seconds) for an example case in which $K_a$ and $K_b$ are initially set to $2^{-1}$ and $2^{-2}$, respectively, and then divided by two at the times indicated by the vertical dashed lines. In this case, the MNC coefficients reach the final values shown in FIGS. 14A & 14B in roughly 3 seconds, and the $a_{k,r}[n]$ coefficients get close to their ideal values in less than $2 \cdot 10^6$ reference periods (~0.08 seconds), which is five times faster than in FIGS. 14A & 14B.

Appendix A

It follows from FIG. 5 and (17) that $$f_I(t) = \sum_{i=5}^{22} [(b_i[w_t] - 1/2)\alpha_i(t)\Delta_i + (b_i[w_t - 1] - 1/2)\gamma_i(t)]. \quad (53)$$

Expressions for each $b_i[w_t] = c_{i+12}[g(w_t)]$ in terms of $d[g(w_t)]$ and the switching sequences can be found by tracing through the tree of FIG. 6 and applying (20) and the expressions shown in FIG. 4(a) and FIG. 4(b). This leads to $$c_i[g(w_t)] - 1/2 = m_i d[g(w_t)]/\Delta + \sum_{k,r} \kappa_{k,r,i} s_{k,r}[g(w_t)], \quad (54)$$

where $$m_i = 0 \text{ for } 17 \leq i \leq 26 \text{ and } m_i = 2^{-16} \text{ for } 27 \leq i \leq 34, \quad (55)$$

and each $x_{k,r,i}$ is one of 0, $-\frac{1}{2}$, $\frac{1}{2}$, $2^{-k}$ or $2^{-k}$. Combining (4)(19) and (53)-(55) yields (26) and (27), where $\alpha_t(t)$ and $\gamma_t(t)$ are the averages of $\alpha_i(t)$ and $(2^{-13}/\Delta)\gamma_i(t)$ for i=15, 16, . . . , 22, respectively, $$\alpha_{k,r}(t) = \sum_{i=5}^{22} \alpha_i(t) \kappa_{i+12} \kappa_{k,r,i+12} \text{ and } \gamma_{k,r}(t) = \sum_{i=5}^{22} \frac{\gamma_i(t)}{\Delta} \kappa_{k,r,i+12}. \quad (56)$$

Each $\alpha_t(t)$, $\gamma_t(t)$, $\alpha_{k,r}(t)$ and $\gamma_{k,r}(t)$ is $T_{fast}$-periodic, because it is a linear combination of $\alpha_i(t)$ and $\gamma_i(t)$, which are $T_{fast}$-periodic.

Appendix B

The phase error of the digital PLL shown of FIG. 9 is given by $$\theta_{PLL}(t) = \int_0^t \psi_{PLL}(u) du, \quad (57)$$

where $\psi_{PLL}(t)$ is the PLL's frequency error at time t. The $\theta_{PLL}[n]$ term in (43) is a sampled version of $\theta_{PLL}(t)$ given by $$\theta_{PLL}[n] = \theta_{PLL}(\tau_n), \quad (58)$$

where $\tau_n = nT_{ref} + \lambda_n$ and $\lambda_n$ is a small implementation-dependent deviation of $\tau_n$ from its ideal value. It follows from (43), (57) and (58) that $$p[n] = p[0] - T_{ref} \sum_{i=1}^{n} \psi_{PLL}[i] + e_p[n], \quad (59)$$

where $$\psi_{PLL}[i] = \frac{1}{T_{ref}} \int_{\tau_{i-1}}^{\tau_i} \psi_{PLL}(u) du \quad (60)$$

is the PLL's average frequency error over the time interval $[\tau_{i-1}, \tau_i]$ and p[0] is the initial value of p[n]. FIG. 9 and (60) imply that $e_R(t)$ causes a term in $\psi_{PLL}[i]$ given by $$\{e_R * h\}[i] = \sum_{j=0}^{\infty} h[j] e_R[i-j], \quad (61)$$

where $$e_R[i] = \frac{1}{T_{ref}} \int_{\tau_{i-1}}^{\tau_i} e_R(u) du \quad (62)$$

and h[j] is the impulse response of the highpass filtering operation imposed by the PLL on the DCO's additive frequency error as discussed in the description above.

In the design example of the example embodiment $\lambda_n = 4.2 T_{fast} + \frac{1}{8} T_{fast} v[n]$, where v[n] is an integer-valued sequence restricted to the set $\{-6, 5, \ldots, 5, 6\}$, so $\tau_n = nT_{ref} + 4.2 T_{fast} + \frac{1}{8} T_{fast} v[n]$. As the magnitude of $\frac{1}{8} T_{fast} v[n]$ is at most $\frac{3}{4} T_{fast}$, its effect is negligible. Furthermore, for the sake of simplicity, $\tau_n$ is assumed to be given by $$\tau_n = \mu_n + 4 T_{fast}, \quad (63)$$

where $\mu_n$, as shown FIG. 10B, is a multiple of $T_{fast}$. Given that $0 < \mu_n - nT_{ref} \leq T_{fast}$ for all n and that $T_{fast}$ is a small fraction of $T_{ref}$, this approximation does not significantly affect the following results. Substituting Error! Reference source not found. with $a_{k,r}$ and $b_{k,r}$ replaced by $a_{k,r}[g(w_t)]$ and $b_{k,r}[g(w_t)]$, respectively, into (35), and the result of this operation and (63) into (62) yields $$e_R[i] = \frac{\Delta}{T_{ref}} \int_{\mu_{i-1}+4T_{fast}}^{\mu_i+4T_{fast}} \{(\delta_{k,r} - \alpha_F a_{k,r}[g(w_t)]) s_{k,r}[g(w_t)] + \quad (64)$$

$$(\gamma_{k,r}(t) - \alpha_F b_{k,r}[g(w_t)])(s_{k,r}[g(w_t-1)] - s_{k,r}[g(w_t)])\} dt.$$

Given that $t \in [\mu_n, \mu_{n+1})$ implies $g(p_t) = n-1$, it follows that $g(w_t) = i-2$ for $t \in [\mu_{i-1} + T_{fast}, \mu_i + T_{fast})$ and $g(w_t) = i-1$ for $t \in [\mu_i + T_{fast}, \mu_{i+1} + T_{fast})$, so (64) can be written as $$e_R[i] = -\Delta \frac{\alpha_F T_{fast}}{T_{ref}} \sum_{k,r} \{y_{k,r-a}[i-1] + y_{k,r-b}[i-1]\}, \quad (65)$$

where $y_{k,r-a}[i]$ and $y_{k,r-b}[i]$ are given by (46) and (47), respectively, and it has been assumed that $q_i = (\mu_{i+1} - \mu_i)/T_{fast}$ is greater than 3 for all i (e.g., $q_i \approx 16$ in the design example). Substituting (65) into (61) and the result into (59), rearranging terms and considering that $s_{k,r}[n] = 0$ for n<0 gives (44) and (45)

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A digital fractional-N phase locked loop (PLL) with multi-rate dynamic element matching (DEM) and an adaptive mismatch-noise cancellation (MNC), comprising:
   a phase error to digital converter;
   a digital loop filter to suppress quantization noise of the phase error to digital converter and drive a digitally controlled oscillator;
   a digitally controlled oscillator (DCO) with a multi-rate DEM encoder driving an integer bank of frequency control elements and a fractional bank of frequency control elements; and
   adaptive mismatch-noise cancellation logic operating to cancel DCO phase error arising from frequency control element (FCE) static and dynamic mismatch error by estimating ideal MNC coefficient values during PLL normal operation, estimating MNC coefficient errors at each sample time, and updating the MNC coefficient values to approach zero FCE static and dynamic mismatch error.

2. The digital fractional-N phase locked loop of claim 1, wherein the updating of the MNC coefficient values is conducted once for each time the phase error of the PLL is measured.

3. The digital fractional-N phase locked loop of claim 1, wherein the multi-rate DEM comprises:
- a slow DEM encoder that drives the integer bank of frequency control elements and a second order $\Delta\Sigma$ modulator; and a fractional path, wherein the fractional path includes the second-order digital $\Delta\Sigma$ modulator driving a fast DEM encoder that drives the fractional bank of frequency control elements, wherein the second-order digital $\Delta\Sigma$ modulator and fast DEM encoder are clocked at a higher frequency compared to that of the slow DEM encoder.

4. The digital fractional-N phase locked loop of claim 3, wherein the $\Delta\Sigma$ modulator's quantization noise is asymptotically independent of its input and dither sequences used in the $\Delta\Sigma$ modulator.

5. The digital fractional-N phase locked loop of claim 3, wherein the adaptive mismatch-noise cancellation logic injects an MNC correction sequence, which is computed from the MNC coefficient values and the switching sequences generated inside the slow DEM encoder, into the fractional path.

6. The digital fractional-N phase locked loop of claim 3, wherein the adaptive mismatch-noise cancellation logic estimates the ideal MNC coefficients with a least-mean-square (LMS)-like algorithm.

7. The digital fractional-N phase locked loop of claim 3, wherein the adaptive mismatch-noise cancellation logic estimates the ideal MNC coefficients based on the statistical properties of switching sequences generated inside the slow DEM encoder.

* * * * *